United States Patent
Ryu et al.

(10) Patent No.: US 10,882,873 B2
(45) Date of Patent: Jan. 5, 2021

(54) METHOD OF FORMING TIN-CONTAINING MATERIAL FILM AND METHOD OF SYNTHESIZING A TIN COMPOUND

(71) Applicant: SAMSUNG ELECTRONICS CO., LTD., Suwon-si (KR)

(72) Inventors: Seung-min Ryu, Hwaseong-si (KR); Youn-soo Kim, Yongin-si (KR); Jae-soon Lim, Seoul (KR); Youn-joung Cho, Hwaseong-si (KR); Myong-woon Kim, Daejeon (KR); Kang-yong Lee, Daejeon (KR); Sang-ick Lee, Daejeon (KR); Sang-yong Jeon, Sejong-si (KR)

(73) Assignees: SAMSUNG ELECTRONICS CO., LTD., Suwon-si (KR); DNF Co., Ltd., Daejeon (KR)

( * ) Notice: Subject to any disclaimer, the term of this patent is extended or adjusted under 35 U.S.C. 154(b) by 13 days.

(21) Appl. No.: 16/249,067

(22) Filed: Jan. 16, 2019

(65) Prior Publication Data
US 2019/0144472 A1   May 16, 2019

Related U.S. Application Data

(62) Division of application No. 15/827,317, filed on Nov. 30, 2017, now abandoned.

(30) Foreign Application Priority Data

Dec. 2, 2016   (KR) .................. 10-2016-0163900

(51) Int. Cl.
C07F 7/22        (2006.01)
C23C 16/455     (2006.01)
C23C 16/40      (2006.01)

(52) U.S. Cl.
CPC .......... *C07F 7/2284* (2013.01); *C23C 16/407* (2013.01); *C23C 16/45553* (2013.01)

(58) Field of Classification Search
None
See application file for complete search history.

(56) References Cited

U.S. PATENT DOCUMENTS

| 8,030,507 B2 | 10/2011 | Kim et al. |
| 8,796,483 B2 | 8/2014 | Gordon et al. |
| 8,946,096 B2 | 2/2015 | Ahn et al. |

FOREIGN PATENT DOCUMENTS

| KR | 10-0954541 B1 | 4/2010 |
| KR | 10-2012-0102985 A | 9/2012 |

(Continued)

OTHER PUBLICATIONS

Barreca et al. Surface Science Spectra (2000), 7(2), 81-85.*
(Continued)

*Primary Examiner* — Clinton A Brooks
(74) *Attorney, Agent, or Firm* — Lee IP Law, P.C.

(57) ABSTRACT

A tin compound, tin precursor compound for atomic layer deposition (ALD), a method of forming a tin-containing material film, and a method of synthesizing a tin compound, the tin compound being represented by Chemical Formula (I):

<Chemical Formula (I)>

(Continued)

wherein $R^1$, $R^2$, $Q^1$, $Q^2$, $Q^3$, and $Q^4$ are each independently a C1 to C4 linear or branched alkyl group.

12 Claims, 23 Drawing Sheets

(56) References Cited

FOREIGN PATENT DOCUMENTS

| KR | 10-2012-0125102 A | 11/2012 |
| KR | 10-2013-0097903 A | 9/2013 |
| KR | 10-2013-0127023 A | 11/2013 |
| KR | 10-2016-0005946 A | 1/2016 |

OTHER PUBLICATIONS

Choi, G., et al., Effect of process parameters on surface morphology and characterization of PE-ALD $SnO_2$ thin films for gas sensing, Appl. Surf. Sci. 252, 7878-7883 (2006).

Du, X. et al., CO Gas Sensing by Ultrathin Tin Oxide Films Grown by Atomic Layer Deposition Using Transmission FTIR Spectorscopy, J. Phys. Chem. A 112, 9211-9219 (2008).

Jones, K., et al., Amino-derivatives of Metals and Metalloids., Part I, J. Chemical Society, 1944-1951 (1965).

Tarre, A., et al., New Routes to $SnO_2$ heteroepitaxy, Vacuum 67, 571-575, (2002).

* cited by examiner

METHOD OF FORMING TIN-CONTAINING MATERIAL FILM AND METHOD OF SYNTHESIZING A TIN COMPOUND

CROSS-REFERENCE TO RELATED APPLICATIONS

This is a divisional application based on pending application Ser. No. 15/827,317, filed Nov. 30, 2017, the entire contents of which is hereby incorporated by reference.

Korean Patent Application No. 10-2016-0163900, filed on Dec. 2, 2016, in the Korean Intellectual Property Office, and entitled: "Tin Compound, Method of Synthesizing the Same, Tin Precursor Compound for ALD, and Method of Forming Tin-Containing Material Film," is incorporated by reference herein in its entirety.

BACKGROUND

1. Field

Embodiments relate to a tin compound, a method of synthesizing the same, a tin precursor compound for atomic layer deposition (ALD), and a method of forming a tin-containing material film.

2. Description of the Related Art

Due to the development of electronic technology, downscaling of semiconductor devices is being quickly performed in recent years. Thus, structures of patterns constituting electronic devices may be more complicated and finer. Along with this, a raw material compound may be capable of forming a tin-containing thin film to a uniform thickness on a complicated and fine 3-dimensional structure by securing thermal stability upon the formation of the tin-containing thin film.

SUMMARY

Embodiments are directed to a tin compound, a method of synthesizing the same, a tin precursor compound for atomic layer deposition (ALD), and a method of forming a tin-containing material film.

The embodiments may be realized by providing a tin compound represented by Chemical Formula (I):

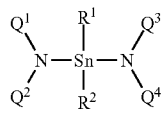

<Chemical Formula (I)> wherein $R^1$, $R^2$, $Q^1$, $Q^2$, $Q^3$, and $Q^4$ are each independently a C1 to C4 linear or branched alkyl group.

The embodiments may be realized by providing a tin precursor compound for atomic layer deposition (ALD), the tin precursor compound having a structure represented by Chemical Formula (I):

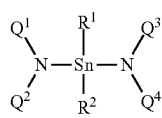

<Chemical Formula (I)> wherein $R^1$, $R^2$, $Q^1$, $Q^2$, $Q^3$, and $Q^4$ are each independently a C1 to C4 linear or branched alkyl group.

The embodiments may be realized by providing a method of forming a tin-containing material film, the method including forming a monolayer of a tin precursor compound on a substrate in a reaction space, the tin precursor compound having a structure represented by Chemical Formula (I); forming a tin-containing material film by supplying a reactant onto the monolayer; and removing unreacted reactant from the vicinity of a surface of the tin-containing material film by purging the unreacted reactant,

<Chemical Formula (I)> wherein $R^1$, $R^2$, $Q^1$, $Q^2$, $Q^3$, and $Q^4$ are each independently a C1 to C4 linear or branched alkyl group.

The embodiments may be realized by providing a method of synthesizing a tin compound, the method including obtaining $SnX_2R_2$ by reacting $SnX_4$ with $SnR_4$ according to Reaction Formula (I); and obtaining $Sn(NQ_2)_2R_2$ by reacting $SnX_2R_2$ with $LiNQ_2$ according to Reaction Formula (II),

$$SnX_4 + SnR_4 \rightarrow SnX_2R_2 \quad \text{<Reaction Formula (I)>}$$

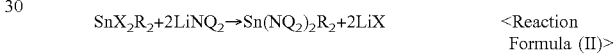

$$SnX_2R_2 + 2LiNQ_2 \rightarrow Sn(NQ_2)_2R_2 + 2LiX \quad \text{<Reaction Formula (II)>}$$

wherein X includes fluorine, chlorine, bromine, or iodine, and R and Q are each independently a C1 to C4 linear or branched alkyl group.

The embodiments may be realized by providing a method of forming a tin-containing material film, the method including providing a substrate in a reactor; supplying a tin precursor to the substrate to form a monolayer of the tin precursor, the tin precursor being represented by Chemical Formula (I); supplying a reactant onto the monolayer to form the tin-containing material film; and purging the reactor,

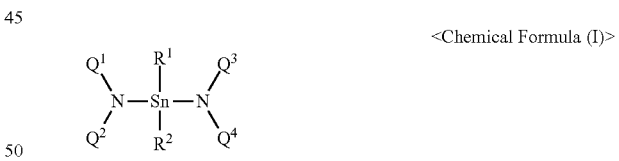

<Chemical Formula (I)> wherein, in Chemical Formula (I), $R^1$, $R^2$, $Q^1$, $Q^2$, $Q^3$, and $Q^4$ are each independently a C1 to C4 linear or branched alkyl group.

The embodiments may be realized by providing a semiconductor device including the tin-containing material film prepared by the method according to an embodiment.

BRIEF DESCRIPTION OF THE DRAWINGS

Features will be apparent to those of skill in the art by describing in detail exemplary embodiments with reference to the attached drawings in which.

DETAILED DESCRIPTION

Tin Compound

Figure 1:
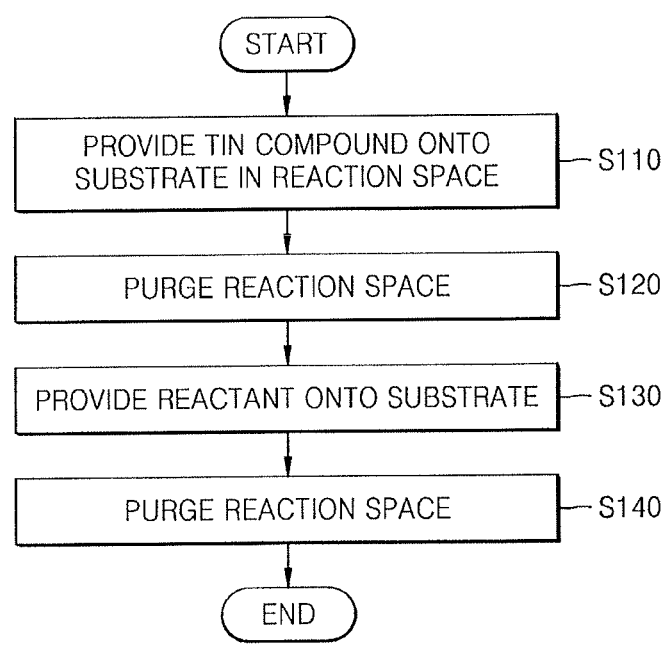
FIG. 1 illustrates a flowchart of a method of forming a tin-containing material film, according to an embodiment.

A tin compound according to an embodiment may be represented by Chemical Formula (I).

<Chemical Formula (I)>

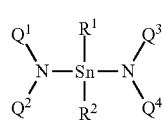

In Chemical Formula (I), $R^1$, $R^2$, $Q^1$, $Q^2$, $Q^3$, and $Q^4$ may each independently be, e.g., a C1 to C4 linear or branched alkyl group, e.g., a methyl group, an ethyl group, a n-propyl group, or an isopropyl group.

In an implementation, $R^1$ and $R^2$ in the tin compound represented by Chemical Formula (I) may be the same as or different from each other. In an implementation, $Q^1$, $Q^2$, $Q^3$, and $Q^4$ in the tin compound represented by Chemical Formula (I) may be the same as or different from each other.

In an implementation, $R^1$ and $R^2$ may be the same, and $Q^1$, $Q^2$, $Q^3$, and $Q^4$ may be the same. The following compounds are examples in which $R^1$ and $R^2$ are the same and $Q^1$, $Q^2$, $Q^3$, and $Q^4$ are the same.

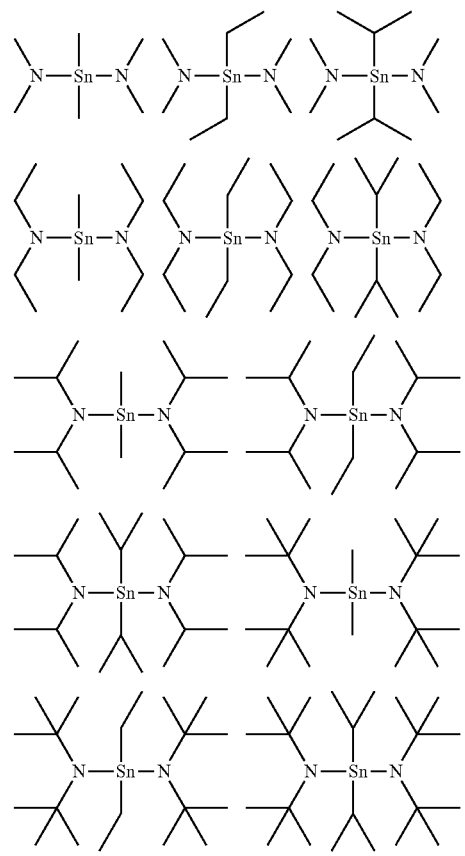

In an implementation, $R^1$ and $R^2$ may be different, and $Q^1$, $Q^2$, $Q^3$, and $Q^4$ may be the same. The following compounds are examples in which $R^1$ and $R^2$ are different and $Q^1$, $Q^2$, $Q^3$, and $Q^4$ are the same.

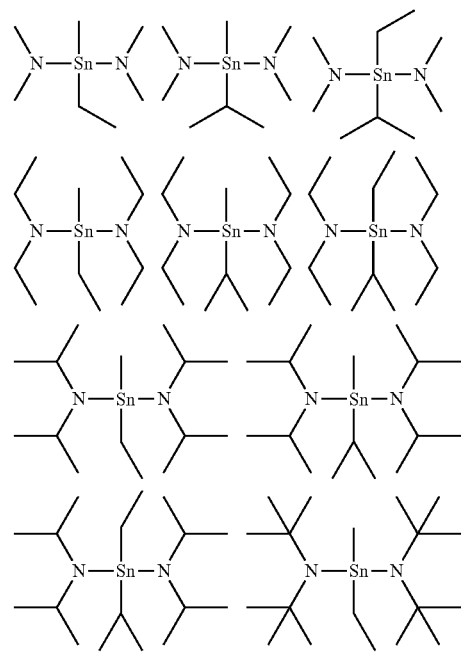

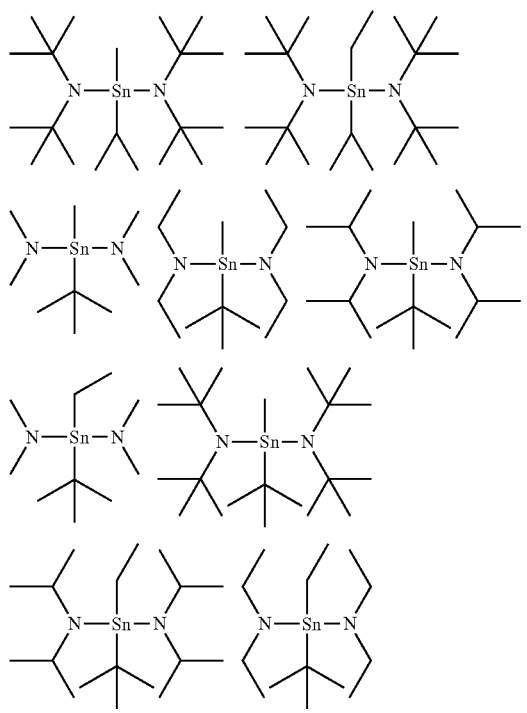

In an implementation, $R^1$ and $R^2$ may be the same, and not all $Q^1$, $Q^2$, $Q^3$, and $Q^4$ may be the same. The following compounds are examples in which $R^1$ and $R^2$ are the same and not all $Q^1$, $Q^2$, $Q^3$, and $Q^4$ are the same.

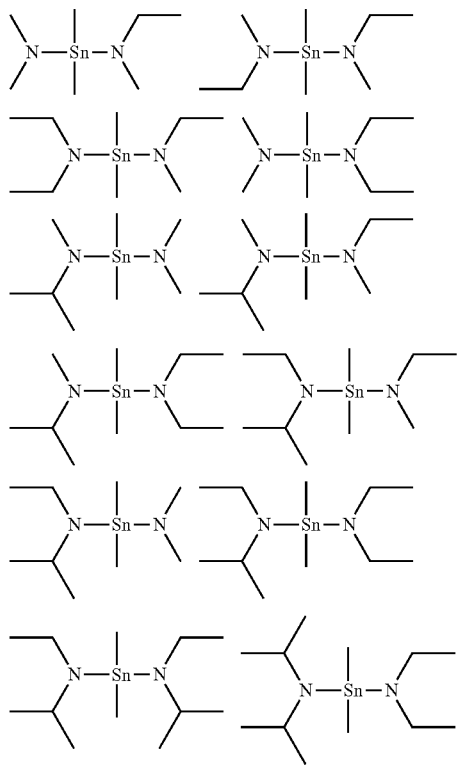

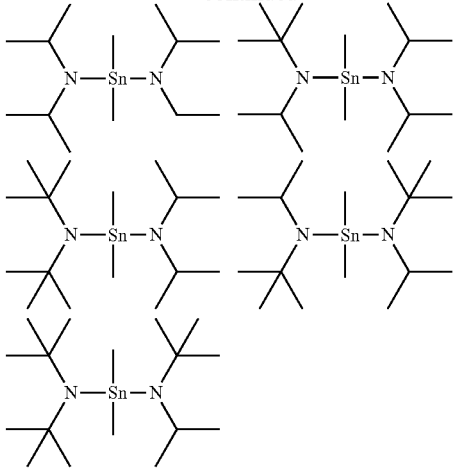

In an implementation, $R^1$ and $R^2$ may be different, and not all $Q^1$, $Q^2$, $Q^3$, and $Q^4$ may be the same. The following compounds are examples in which $R^1$ and $R^2$ are different and not all $Q^1$, $Q^2$, $Q^3$, and $Q^4$ are the same.

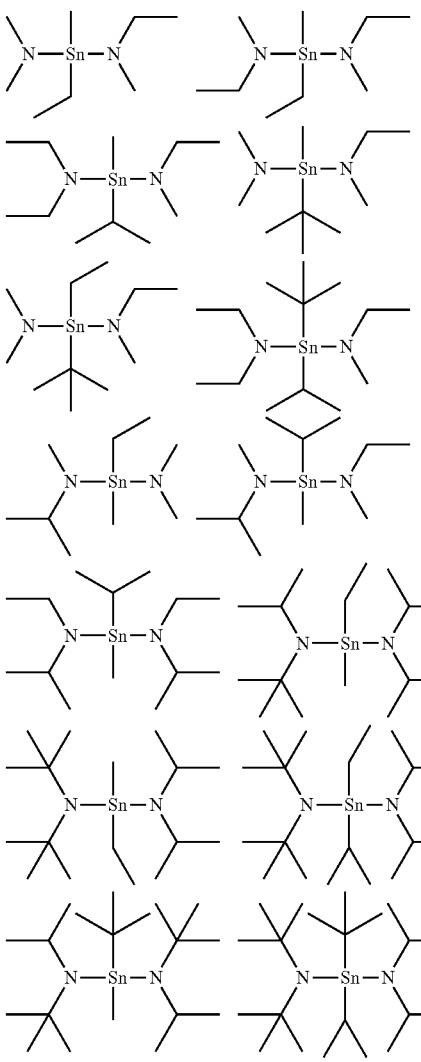

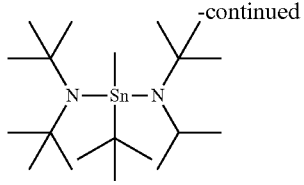
-continued

In an implementation, $R^1$ and $R^2$ may be methyl groups, and all of $Q^1$, $Q^2$, $Q^3$, and $Q^4$ may be isopropyl groups. In an implementation, $R^1$ and $R^2$ may be methyl groups, and all of $Q^1$, $Q^2$, $Q^3$, and $Q^4$ may also be methyl groups. In an implementation, $R^1$ and $R^2$ may be ethyl groups, and all of $Q^1$, $Q^2$, $Q^3$, and $Q^4$ may be isopropyl groups.

The tin compound according to embodiments may exhibit a substantially constant deposition rate at a temperature of about 250° C. to about 350° C. when applied to an atomic layer deposition process. In an implementation, the tin compound may exhibit excellent long-term storability due to high stability thereof at room temperature.

The tin compound according to an embodiment may exist in a liquid state at room temperature, and storage and handling thereof may be facilitated. The tin compound according to an embodiment may have good thermal stability and high reactivity, and the tin compound may form a tin-containing material film with excellent step coverage when applied to atomic layer deposition. The tin compound may not include halogen elements, and the produced tin-containing material film may not include halogen impurities.

Method of Synthesizing Tin Compound

Hereinafter, a method of synthesizing the tin compound represented by Chemical Formula (I) is described.

First, a tin halide and an alkyl compound of tin may be prepared as starting materials and reacted with each other according to Reaction Formula (I).

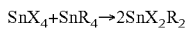
<Reaction Formula (I)>

In Reaction Formula (I), X may include, e.g., fluorine (F), chlorine (Cl), bromine (Br), or iodine (I). The four Xs bonded to one Sn atom may be the same or different. R may be, e.g., a C1 to C4 linear or branched alkyl group. The four Rs bonded to one Sn atom may be the same or different.

The reaction of Reaction Formula (I) may be performed, e.g., at room temperature or lower. In an implementation, the reaction of Reaction Formula (I) may be performed at a temperature of about 0° C. to about 15° C.

$SnX_2R_2$, which is an intermediate product produced by the reaction of Reaction Formula (I), may be separated, followed by obtaining the tin compound represented by Chemical Formula (I) by reaction according to Reaction Formula (II).

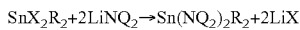
<Reaction Formula (II)>

Q may be, e.g., a C1 to C4 linear or branched alkyl group. The two Qs bonded to one nitrogen (N) atom may be the same or different.

For example, the intermediate product $SnX_2R_2$ may be brought into contact with a lithium amine compound substituted with a C1 to C4 linear or branched alkyl group, thereby producing a final product $Sn(NQ_2)_2R_2$.

For example, when a tin compound of $Sn[N(iPr)_2]_2Me_2$ is intended to be synthesized, an intermediate product of $Sn(CH_3)_2Cl_2$ may be obtained by reacting $SnCl_4$, which is taken as a starting material, with $Sn(CH_3)_4$, followed by reacting the intermediate product with lithium diisopropylamide ($LiN(iPr)_2$), thereby obtaining the desired tin compound.

For example, when a tin compound of $Sn[N(Me)_2]_2Me_2$ is intended to be synthesized, an intermediate product of $Sn(CH_3)_2Cl_2$ may be obtained by reacting $SnCl_4$, which is taken as a starting material, with $Sn(CH_3)_4$, followed by reacting the intermediate product with lithium dimethylamide ($LiN(Me)_2$), thereby obtaining the desired tin compound.

As used herein, the abbreviation "Me" refers to a methyl group, and the abbreviation "iPr" refers to an isopropyl group. In addition, as used herein, the terms "room temperature" and "ambient temperature" refer to a temperature ranging from about 20° C. to about 28° C., and may vary with the seasons.

In an implementation, the reaction of Reaction Formula (II) may be performed, e.g., at a temperature of about 10° C. to about 50° C.

Formation of Tin-Containing Material Film

The tin compound described above may be used as a tin precursor compound for forming a tin-containing material film, e.g., a tin metal film, a tin oxide film, a tin nitride film, a tin oxynitride film, or a tin oxycarbonitride film. Hereinafter, a method of forming a tin oxide film by atomic layer deposition (ALD) will be mainly described. It will be understood by one of ordinary skill that a tin metal film, a tin nitride film, a tin oxynitride film, or a tin oxycarbonitride film may be formed by a similar method.

Figure 2:
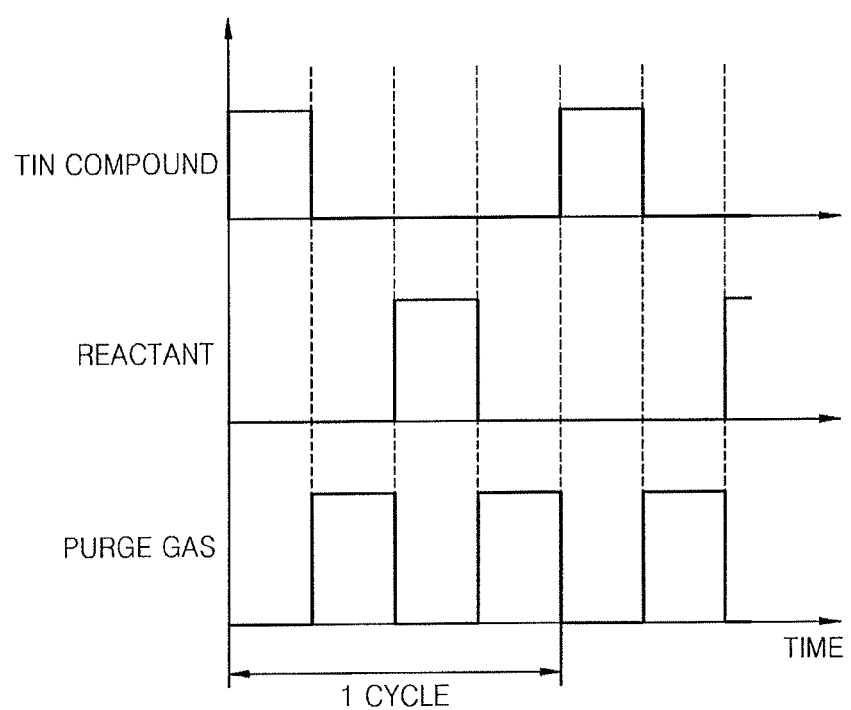
FIG. 2 illustrates a timing diagram of the method of forming the tin-containing material film.
Figure 3A:
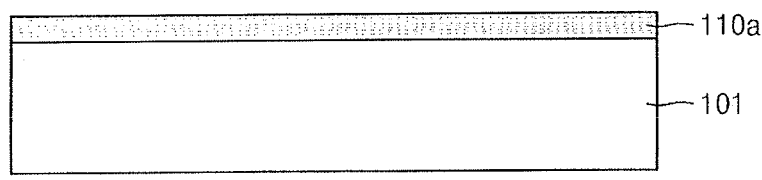
FIGS. 3A and 3B illustrate cross-sectional views of stages in a method of forming a tin-containing material film on a substrate, according to an embodiment.
Figure 3B:
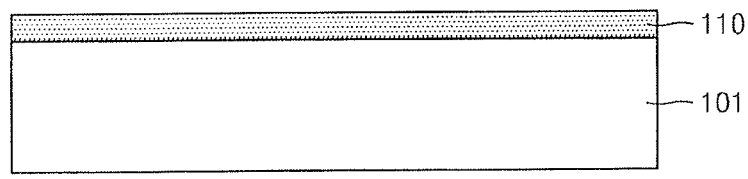

FIG. 1 illustrates a flowchart of a method of forming a tin-containing material film, according to an embodiment. FIG. 2 illustrates a timing diagram of the method of forming the tin-containing material film. FIGS. 3A and 3B illustrate cross-sectional views of stages in the method of forming the tin-containing material film on a substrate, according to an embodiment.

Referring to FIGS. 1, 2, and 3A, a substrate 101 may be provided into a reaction space, and a tin precursor compound represented by Chemical Formula (I) may be supplied onto the substrate 101, thereby forming a monolayer 110a of the tin precursor compound (S110).

The substrate 101 may include a semiconductor element, e.g., silicon (Si) or germanium (Ge), or a compound semiconductor, e.g., silicon carbide (SiC), gallium arsenide (GaAs), indium arsenide (InAs), or indium phosphide (InP). In an implementation, the substrate 101 may include a semiconductor substrate, and structures including at least one insulating film or at least one conductive region formed on the semiconductor substrate. The at least one conductive region may include, e.g., an impurity-doped well, or an impurity-doped structure.

The forming of the monolayer 110a by supplying the tin precursor compound represented by Chemical Formula (I) onto the substrate 101 may be performed while the substrate 101 is maintained at a temperature of about 150° C. to about 600° C. or about 250° C. to about 350° C. Maintaining the temperature of the substrate 101 at about 150° C. or greater may help ensure that ALD reaction on the substrate 101 sufficiently occurs. Maintaining the temperature of the substrate 101 at about 600° C. or less may help ensure that ALD reaction sufficiently occurs by helping to prevent thermal decomposition of the tin precursor compound.

The tin precursor compound represented by Chemical Formula (I) may be supplied onto the substrate 101 for about 1 second to about 100 seconds. Maintaining the supply time of the tin precursor compound at about 1 second or greater may help ensure that the tin precursor compound is provided at a concentration suitable for chemisorption. Maintaining the supply time of the tin precursor compound at about 100 seconds or less may help ensure that the tin precursor compound is not excessively supplied, thus avoiding an economic disadvantage.

Although being a liquid at room temperature, the tin precursor compound represented by Chemical Formula (I) may be vaporized at a relatively low temperature, e.g., a temperature of about 120° C. to about 180° C. The vaporized tin precursor compound represented by Chemical Formula (I) may be chemisorbed onto a surface of the substrate 101, thereby forming a monolayer of the tin precursor compound. In an implementation, the tin precursor compound physisorbed onto the monolayer may further exist and may be removed in a subsequent purge process.

Next, a purge gas may be supplied onto the surface of the substrate 101, thereby removing the unadsorbed or physisorbed tin precursor compound represented by Chemical Formula (I) from the reaction space (S120). The purge gas may include, e.g., an inert gas such as argon (Ar), helium (He), or neon (Ne), $N_2$ gas, or the like.

In an implementation, as illustrated in FIG. 2, the purge gas may be supplied at the moment when the supply of the tin precursor compound is terminated. In an implementation, the purge gas may be used as a carrier gas of the tin precursor compound, and the purge gas may continue to be supplied while only the supply of the tin precursor compound is terminated, thereby achieving the purge of the reaction space.

Referring to FIGS. 1, 2, and 3B, a reactant may be supplied onto the surface of the substrate 101, thereby reacting the reactant with the tin precursor compound represented by Chemical Formula (I), the tin precursor compound forming the monolayer (S130). The reactant may be supplied in a vapor phase, and may be selected by taking into account the kind of tin-containing material film 110 to be formed on the substrate 101.

For example, when plasma-enhanced atomic layer deposition (PEALD) is used, plasma may be generated by applying RF power to the reactant. The RF power may be applied to the reactant, which flows for a pulse time period of the reactant, continuously flows through the reaction space, and/or flows through a remote plasma generator. Therefore, in some embodiments, the plasma may be generated in situ, and in some other embodiments, the plasma may be remotely generated. In an implementation, the RF power applied to the reactant may range from about 10 W to about 2,000 W, e.g., about 100 W to about 1,000 W or from about 200 W to about 500 W. In an implementation, if allowed without damaging the substrate 101, the RF power may be greater than 2,000 W.

In an implementation, when a tin oxide film is to be formed as the tin-containing material film 110, the reactant may include, e.g., $O_2$, $O_3$, plasma $O_2$, $H_2O$, $NO_2$, NO, $N_2O$ (nitrous oxide), $CO_2$, $H_2O_2$, HCOOH, $CH_3COOH$, $(CH_3CO)_2O$, or mixtures thereof. In an implementation, when a tin nitride film is to be formed as the tin-containing material film 110, the reactant may include, e.g., $NH_3$, monoalkylamine, a dialkylamine, a trialkylamine, an organic amine compound, a hydrazine compound, or mixtures thereof. In an implementation, the reactant may be a reductive gas, e.g., $H_2$.

When the tin-containing material film 110 includes carbon, a material capable of being used as a carbon precursor, which is a carbon source, may include, e.g., methane ($CH_4$), methanol ($CH_3OH$), carbon monoxide (CO), ethane ($C_2H_6$), ethylene ($C_2H_4$), ethanol ($C_2H_5OH$), acetylene ($C_2H_2$), acetone ($CH_3COCH_3$), propane ($CH_3CH_2CH_3$), propylene ($C_3H_6$), butane ($C_4H_{10}$), pentane ($CH_3(CH_2)_3CH_3$), pentene ($C_5H_{10}$), cyclopentadiene ($C_5H_6$), hexane ($C_6H_{14}$), cyclohexane ($C_6H_{12}$), benzene ($C_6H_6$), toluene ($C_7H_8$), or xylene ($C_6H_4(CH_3)_2$).

Next, the purge gas may be supplied onto the surface of the substrate 101, thereby removing the unreacted reactant from the reaction space (S140). Here, by-products, which are obtained by reaction between the reactant and the tin precursor compound forming the monolayer, or the like, may also be simultaneously removed. The purge gas may include, e.g., an inert gas such as argon (Ar), helium (He), or neon (Ne), $N_2$ gas, or the like.

The operations described above may constitute one cycle, and may be repeated so that the tin-containing material film 110 having a desired thickness is obtained.

To apply the tin precursor compound represented by Chemical Formula (I) to ALD, conditions in the reactor should be such that a temperature range allowing ALD are present. An increase rate of the thickness of the tin-containing material film per cycle may be constant in the temperature range allowing ALD. As such, the temperature range allowing ALD is referred to as an ALD window, and the ALD window may depend upon the tin precursor compound. If the ALD window were to be too narrow, it could be difficult to perform ALD due to a narrow process margin of an ALD process. In addition, some tin compounds, e.g., those not represented by Chemical Formula (I), may not have the temperature range in which the increase rate of the thickness of the tin-containing material film per cycle is constant, e.g., may not have the ALD window.

At a deposition temperature out of the ALD window, the increase rate of the thickness of the tin-containing material film per cycle may somewhat vary depending upon the deposition temperature, despite use of the tin precursor compound represented by Chemical Formula (I). For example, a deposition mechanism other than ALD may partially occur in deposition of the tin-containing material film. For example, such a temperature-dependent change of the increase rate of the thickness of the tin-containing material film per cycle may result from partial or overwhelming intervention of a mechanism of chemical vapor deposition.

Formation of Tin-Containing Material Film by CVD

Although an example in which the tin-containing material film is formed by ALD has been described above, the tin precursor compound represented by Chemical Formula (I) may also be used as a precursor material for chemical vapor deposition (CVD).

For example, the tin-containing material film may be formed on a substrate by using the tin precursor compound represented by Chemical Formula (I). The tin precursor compound represented by Chemical Formula (I) may be in a liquid phase at room temperature and stable, and may be vaporized at a temperature of about 120° C. to about 180° C. and thus may undergo CVD even at a relatively low temperature.

A thin film forming raw material for forming the tin-containing material film may vary depending upon a thin film intended to be formed. In some embodiments, when a thin film including only tin (Sn) is fabricated, the thin film forming raw material may not include metal compounds and semimetal compounds other than the tin precursor compound according to an embodiment. In an implementation, when a thin film including two or more metals and/or semimetals is fabricated, the thin film forming raw material may include a compound (referred to as the term "another precursor" hereinafter) containing a desired metal or semimetal, in addition to the tin precursor compound according to an embodiment. In an implementation, the thin film forming raw material may include an organic solvent or a nucleophilic reagent in addition to the tin precursor compound according to an embodiment.

When the thin film forming raw material is a raw material for use in a CVD process, the composition of the thin film forming raw material may be appropriately selected depending upon a specific method of the CVD process, a raw material transfer method, or the like.

The raw material transfer method may include a gas transfer method and a liquid transfer method. In the gas transfer method, a raw material for CVD may be made to be in a vapor state by vaporizing the raw material through heating or decompression in a container (which may be referred to as the term "raw material container" hereinafter) in which the raw material is stored, and the vapor-state raw material and a carrier gas such as argon, nitrogen, helium, or the like, which is used as needed, may be simultaneously supplied into a chamber (which may be referred to as the term "deposition reactor" hereinafter), in which the substrate is placed, for about 1 second to about 600 seconds. In the liquid transfer method, the raw material for CVD may be transferred in a liquid or solution state to a vaporizer and made into vapor by vaporizing the raw material through heating and/or decompression in the vaporizer, followed by introducing the vapor into the chamber. In the gas transfer method, the tin precursor compound itself represented by Chemical Formula (I) may be used as a CVD raw material. The CVD raw material may further include another precursor, a nucleophilic reagent, or the like. In an implementation, a temperature inside the chamber may be maintained at about 100° C. to about 1,000° C. In an implementation, a pressure inside the chamber may be maintained at about 10 Pa to about 1 atmosphere (atm).

In an implementation, in the method of forming the tin-containing material film, a multi-component CVD process may be used to form the tin-containing material film. In the multi-component CVD process, a method of supplying raw material compounds, which are to be used for the CVD process, independently for each component (hereinafter, the method may be referred to as the term "single source method"), or a method of supplying a multi-component raw material by vaporizing a raw material mixture in which multiple components are mixed in a desired composition ratio (hereinafter, the method may be referred to as the term "cocktail source method") may be used. When the cocktail source method is used, a first mixture including the tin precursor compound according to an embodiment, a first mixed solution in which the first mixture is dissolved in an organic solvent, a second mixture including the tin precursor compound according to an embodiment and another precursor, or a second mixed solution in which the second mixture is dissolved in an organic solvent may be used as a thin film forming raw material compound in the CVD process. Each of the first and second mixtures and the first and second mixed solutions may further include a nucleophilic reagent.

The organic solvent for obtaining the first or second mixed solution may include, e.g., acetate esters such as ethyl acetate and methoxyethyl acetate; ethers such as tetrahydrofuran, tetrahydropyran, ethylene glycol dimethyl ether, diethylene glycol dimethyl ether, triethylene glycol dimethyl ether, dibutyl ether, and dioxane; ketones such as methyl butyl ketone, methyl isobutyl ketone, ethyl butyl ketone, dipropyl ketone, diisobutyl ketone, methyl amyl ketone, cyclohexanone, and methylcyclohexanone; hydrocarbons such as hexane, cyclohexane, methylcyclohexane, dimethylcyclohexane, ethylcyclohexane, heptane, octane, toluene, and xylene; cyano group-containing hydrocarbons such as 1-cyanopropane, 1-cyanobutane, 1-cyanohexane, cyanocyclohexane, cyanobenzene, 1,3-dicyanopropane, 1,4-dicyanobutane, 1,6-dicyanohexane, 1,4-dicyanocyclohexane, and 1,4-dicyanobenzene; pyridine; lutidine; or the like. The organic solvents set forth above as examples may be used alone or in combination, by taking into account solubility of a solute, temperatures for use thereof and melting points thereof, flash points thereof, or the like. The tin precursor compound according to an embodiment and the another precursor may be present in a total concentration of about 0.01 mol/L to about 2.0 mol/L, e.g., about 0.05 mol/L to about 1.0 mol/L, in the organic solvent. Here, the total concentration of the tin precursor compound and the another precursor refers to an amount of the tin precursor compound when the thin film forming raw material does not include metal compounds and semimetal compounds other than the tin precursor compound, and refers to a sum of amounts of the tin precursor compound and the another precursor when the thin film forming raw material further includes, in addition to the tin precursor compound, a compound containing other metals than tin or a compound containing semimetals.

In an implementation, examples of the other precursor in the method of forming the thin film may include at least one Si or metal compound selected from among compounds having hydride, hydroxide, halide, azide, alkyl, alkenyl, cycloalkyl, allyl, alkynyl, amino, dialkylaminoalkyl, monoalkylamino, dialkylamino, diamino, di(silyl-alkyl)amino, di(alkyl-silyl)amino, disilylamino, alkoxy, alkoxyalkyl, hydrazide, phosphide, nitrile, dialkylaminoalkoxy, alkoxyalkyldialkylamino, siloxy, diketonate, cyclopentadienyl, silyl, pyrazolate, guanidinate, phosphoguanidinate, amidinate, ketoiminate, diketoiminate, carbonyl, and phosphoamidinate groups as ligands.

In an implementation, the metal included in the other precursor may include, e.g., magnesium (Mg), calcium (Ca), strontium (Sr), barium (Ba), radium (Ra), scandium (Sc), yttrium (Y), titanium (Ti), zirconium (Zr), hafnium (Hf), vanadium (V), niobium (Nb), chromium (Cr), molybdenum (Mo), tungsten (W), manganese (Mn), iron (Fe), osmium (Os), cobalt (Co), rhodium (Rh), iridium (Ir), nickel (Ni), palladium (Pd), platinum (Pt), copper (Cu), silver (Ag), gold (Au), zinc (Zn), cadmium (Cd), aluminum (Al), gallium (Ga), indium (In), germanium (Ge), tantalum (Ta), lead (Pb), antimony (Sb), bismuth (Bi), lanthanum (La), cerium (Ce), praseodymium (Pr), neodymium (Nd), promethium (Pm), samarium (Sm), europium (Eu), gadolinium (Gd), terbium (Tb), dysprosium (Dy), holmium (Ho), erbium (Er), thulium (Tm), ytterbium (Yb), or the like.

In an implementation, when an alcohol compound is used as an organic ligand, the other precursor may be prepared by reacting an inorganic salt of the metal set forth above or a hydrate thereof with an alkali metal alkoxide of the alcohol compound. In an implementation, examples of the inorganic salt of the metal or the hydrate thereof may include halides, nitrates, and the like of the metal, and examples of the alkali metal alkoxide may include sodium alkoxides, lithium alkoxides, potassium alkoxides, and the like.

In the single source method, as the other precursor, a compound exhibiting thermal and/or oxidative decomposition behaviors that are similar to those of the tin precursor compound according to an embodiment may be used. In addition, in the cocktail source method, it is suitable to use, as the other precursor, a compound that exhibits thermal and/or oxidative decomposition behaviors similar to those of the tin precursor compound and is not altered by chemical reactions or the like upon mixing thereof.

Application of Tin-Containing Material Film

The tin-containing material film fabricated by the method of forming the thin film, may be used for various purposes. For example, the tin-containing material film may be used for a gate of a transistor, a conductive barrier film included in a metal wire such as a copper wire, a tunnel barrier film of a gate dielectric film included in a 3-dimensional charge trap flash (CTF) cell, a barrier metal film for liquid crystals, a member for thin film solar cells, a member for semiconductor equipment, a nano-structure, or the like.

FIGS. 4A to 4H illustrate cross-sectional views of stages in a method of fabricating an integrated circuit device, according to embodiments. A method of fabricating a memory cell array of an integrated circuit device 200 (see FIG. 4H) constituting a vertical non-volatile memory device will be described with reference to FIGS. 4A to 4H.

Figure 4A:
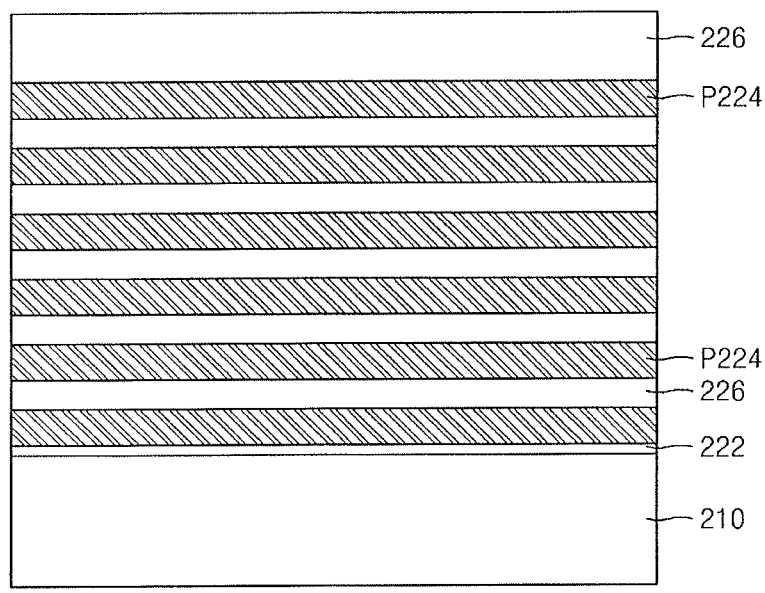
FIGS. 4A to 4H illustrate cross-sectional views of stages in a method of fabricating an integrated circuit device, according to embodiments.

Referring to FIG. 4A, an etch stop insulating film 222 may be formed on a substrate 210, and a plurality of sacrificial layers P224 and a plurality of insulating layers 226 may be alternately stacked on the etch stop insulating film 222, layer by layer. A thickness of the uppermost insulating layer 226 may be greater than a thickness of another insulating layer 226.

The substrate 210 may be the same as the substrate 101 described above, and repeated descriptions thereof may be omitted.

The etch stop insulating film 222 and the plurality of insulating layers 226 may include an insulating material, e.g., silicon oxide. The plurality of sacrificial layers P224 may include a material having etch selectivity that is different from those of the etch stop insulating film 222 and the plurality of insulating layers 226. For example, the plurality of sacrificial layers P224 may include a silicon nitride film, a silicon oxynitride film, a polysilicon film, or a polysilicon germanium film.

Figure 4B:
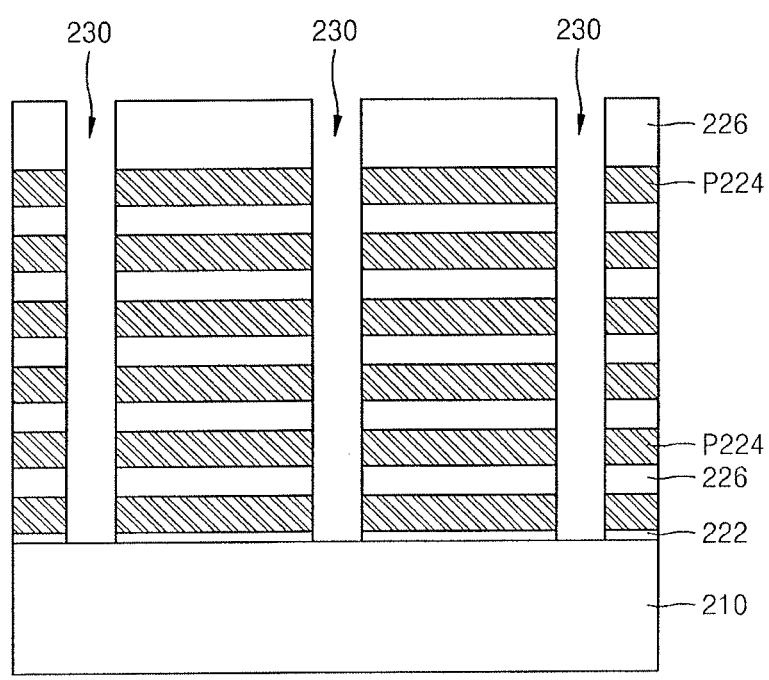

Referring to FIG. 4B, a plurality of channel holes 230 may be formed through the plurality of insulating layers 226, the plurality of sacrificial layers P224, and the etch stop insulating film 222 and may expose the substrate 210.

Figure 4C:
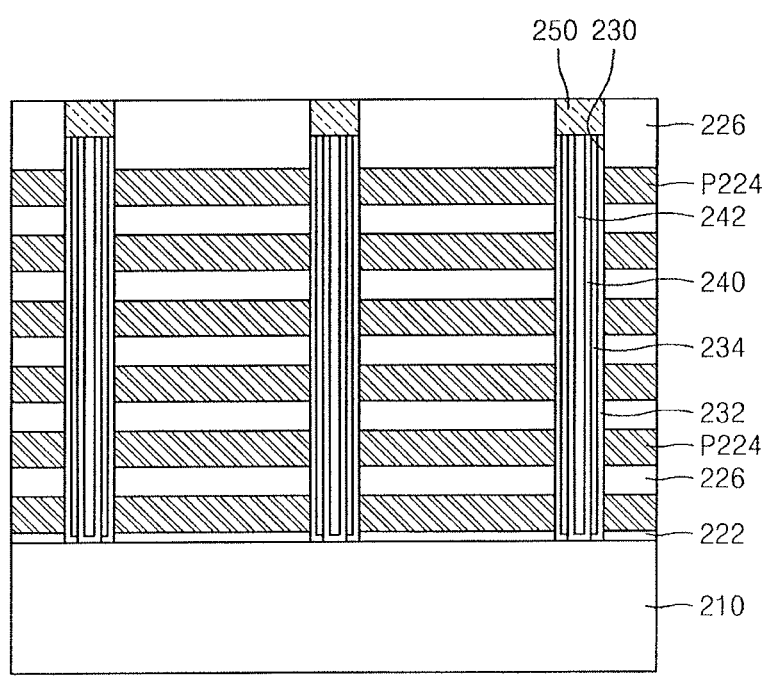

Referring to FIG. 4C, a charge storage film 232 and a tunnel dielectric film 234 may be formed in this stated order and cover an inner wall of each of the plurality of channel holes 230, and a channel region 240 may be formed and covers the tunnel dielectric film 234.

For example, the charge storage film 232 and the tunnel dielectric film 234 may be formed in the plurality of channel holes 230. Next, a channel region-forming semiconductor film may be formed on the tunnel dielectric film 234 in the plurality of channel holes 230, followed by anisotropically etching the semiconductor film, thereby exposing the substrate 210 in each of the plurality of channel holes 230. The semiconductor film may remain as the spacer-shaped channel region 240, which covers a sidewall of the tunnel dielectric film 234 in each of the plurality of channel holes 230. In an implementation, the charge storage film 232 may include a silicon nitride film. The tunnel dielectric film 234 may include a silicon oxide film.

The channel region 240 may not completely fill an inside of each channel hole 230. An insulating film 242 may fill a space remaining above the channel region 240 in each channel hole 230.

Next, the charge storage film 232, the tunnel dielectric film 234, the channel region 240, and the insulating film 242 in the plurality of channel holes 230 may be partially removed, whereby an upper space may be formed in each of the plurality of channel holes 230, and a conductive pattern 250 may fill the upper space. The conductive pattern 250 may include doped polysilicon or a metal. The conductive pattern 250 may be used as a drain region.

Figure 4D:
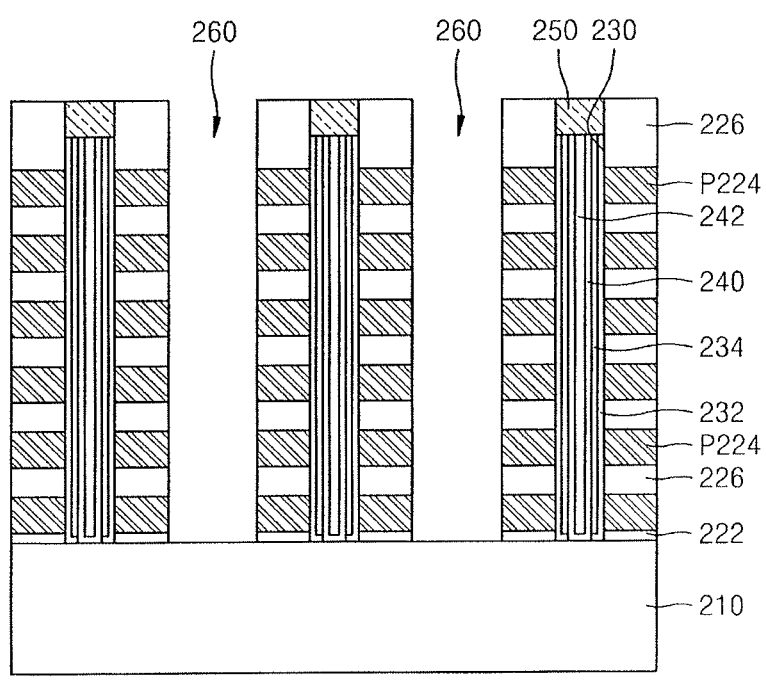

Referring to FIG. 4D, a plurality of openings 260 may be formed through the plurality of insulating layers 226, the plurality of sacrificial layers P224, and the etch stop insulating film 222 and may expose the substrate 210. Each of the plurality of openings 260 may be a word line cut region.

Figure 4E:
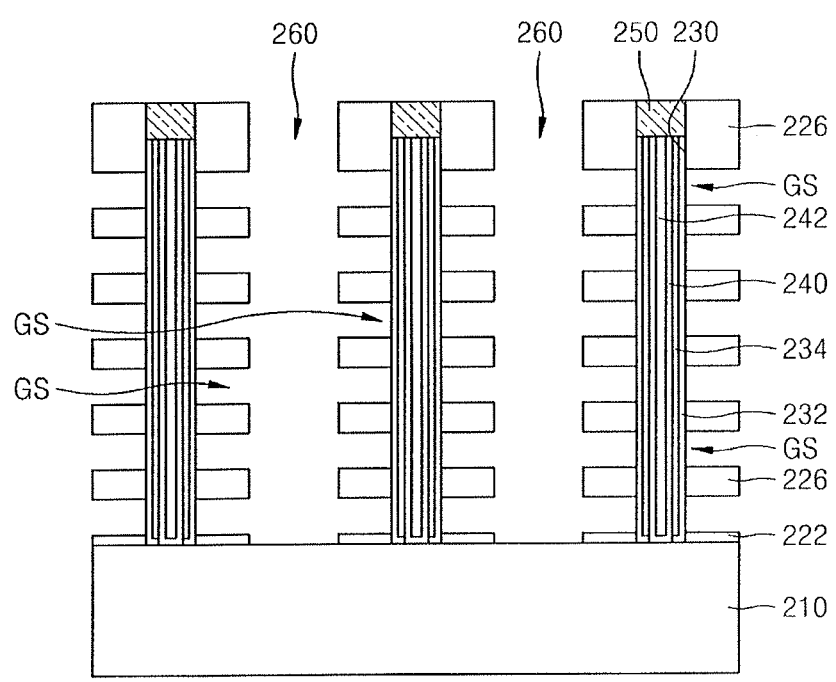

Referring to FIG. 4E, the plurality of sacrificial layers P224 may be removed from the plurality of openings 260, thereby forming a plurality of gate spaces GS each between two of the plurality of insulating layers 226. The charge storage film 232 may be exposed by the plurality of gate spaces GS.

Figure 4F:
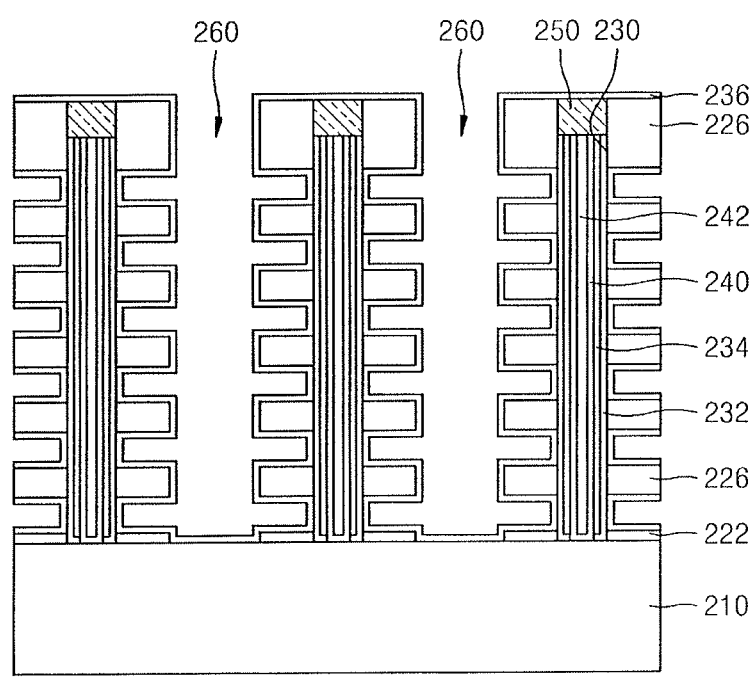

Referring to FIG. 4F, a blocking insulating film 236 may be formed and may cover inner walls of the plurality of gate spaces GS.

The blocking insulating film 236 may include a tin oxide film. To form the blocking insulating film 236, the method of forming the thin film may be used, the method having been described with reference to FIGS. 1 to 3B. In an implementation, to form the blocking insulating film 236, an ALD process may be used. As a Sn source, the tin precursor compound according to an embodiment, e.g., the tin precursor compound represented by Chemical Formula (I), may be supplied through the plurality of openings 260. The ALD process may be performed at a first temperature selected from a range of about 250° C. to about 350° C. After the formation of the tin oxide film, the tin oxide film may be densified by annealing the tin oxide film at a second temperature that is higher than the first temperature. The second temperature may be selected from a range of about 400° C. to about 1,150° C.

Figure 4G:
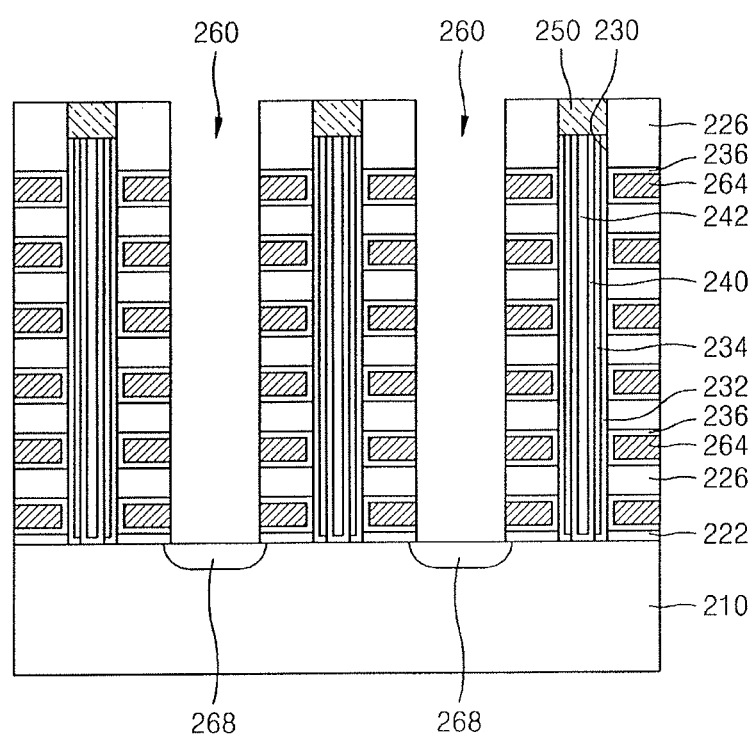

Referring to FIG. 4G, a conductive layer for gate electrodes may be formed and may fill spaces surrounded by the blocking insulating film 236 and remaining in the plurality of gate spaces GS, followed by partially removing the blocking insulating film 236 and the conductive layer for gate electrodes so that a sidewall of each of the plurality of insulating layers 226 in the plurality of openings 260 is exposed, whereby the blocking insulating film 236 and a gate electrode 264 remain in the plurality of openings 260.

In an implementation, the gate electrode 264 may include a first conductive barrier film contacting the blocking insulating film 236, and a first conductive film on the first conductive barrier film. The first conductive barrier film may include a conductive metal nitride, e.g., TiN or TaN. The first conductive film may include conductive polysilicon, a metal, a metal silicide, or combinations thereof.

The blocking insulating film 236 may include a tin oxide film free from undesired foreign substances such as halogen materials or carbon residue. As described with reference to FIG. 4F, the tin oxide film may be annealed and thus densified, thereby preventing, e.g., damage of a constitution material of the gate electrode 264 filling the gate spaces GS since an excess of the blocking insulating film 236 may be consumed by an etching solution or the blocking insulating film 236 at entrance sides of the plurality of gate spaces GS undergoes undesired removal by an etching solution, while the blocking insulating film 236 and the conductive layer for gate electrodes are partially removed in the process of FIG. 4G so that the sidewall of each of the plurality of insulating layers 226 may be exposed.

As described above, after the blocking insulating film 236 and the gate electrode 264 are formed in the plurality of gate spaces GS, the substrate 210 may be exposed by the plurality of openings 260. A plurality of common source regions 268 may be formed in the substrate 210 by implanting impurities into the substrate 210 exposed by the plurality of openings 260.

Figure 4H:
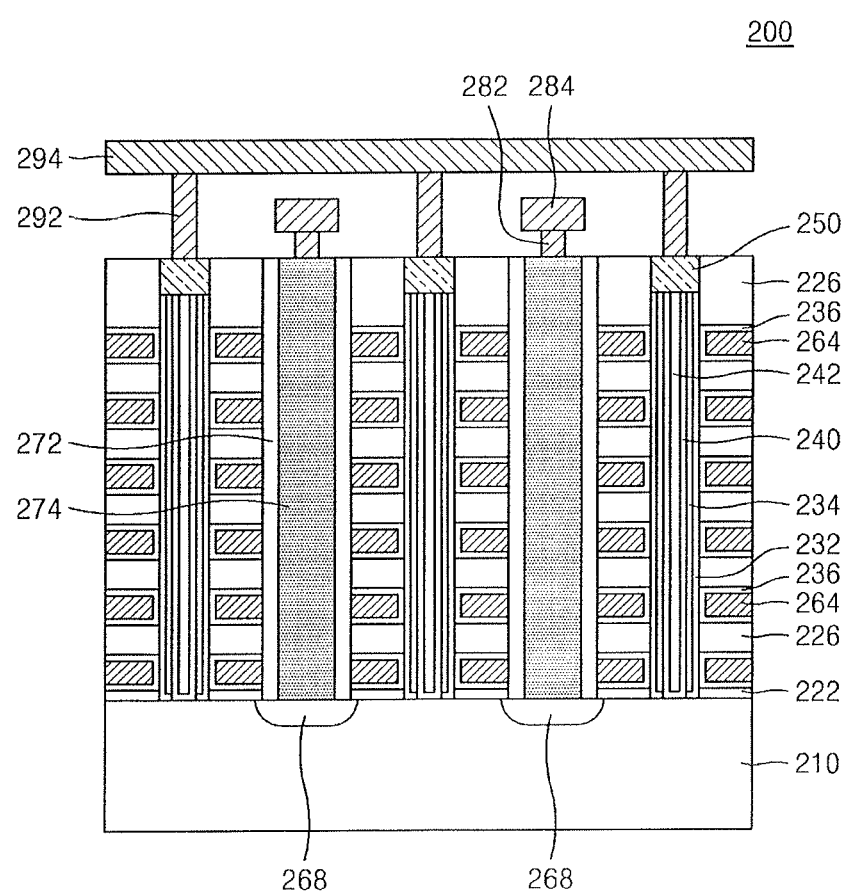

Referring to FIG. 4H, an insulating spacer 272 may be formed on an inner sidewall of each of the plurality of openings 260, and a conductive plug 274 may fill an inner space of each of the plurality of openings 260.

In an implementation, the insulating spacer 272 may include a silicon oxide film, a silicon nitride film, or combinations thereof. The conductive plug 274 may include a second conductive barrier film contacting the insulating spacer 272, and a second conductive film filling a space surrounded by the second conductive barrier film in each of the plurality of openings 260. The second conductive barrier film may include a conductive metal nitride, e.g., TiN or TaN. The second conductive film may include a metal, e.g., tungsten.

A plurality of first contacts 282 may be respectively formed on a plurality of conductive plugs 274, and a plurality of first conductive layers 284 may be respectively formed on the plurality of first contacts 282. Each of the plurality of first contacts 282 and the plurality of first conductive layers 284 may include a metal, a metal nitride, or combinations thereof.

A plurality of second contacts 292 and a plurality of bit lines 294 may be formed on a plurality of conductive patterns 250. Each of the plurality of second contacts 292 and the plurality of bit lines 294 may include a metal, a metal nitride, or combinations thereof.

According to the method of fabricating the integrated circuit device 200, which has been described with reference to FIGS. 4A to 4H, the tin precursor compound according to an embodiment may be used in the ALD process for forming the blocking insulating film 236 including tin oxide, thereby securing properties required as a raw material compound upon the ALD process, e.g., high thermal stability, low melting point, high vapor pressure, transportability in a liquid state, ease of vaporization, and the like. Therefore, the blocking insulating film 236 may be easily formed by using the tin precursor compound according to an embodiment. In addition, the blocking insulating film 236 having uniform step coverage along the depths of holes having relatively high aspect ratios may be obtained.

Figure 5A:
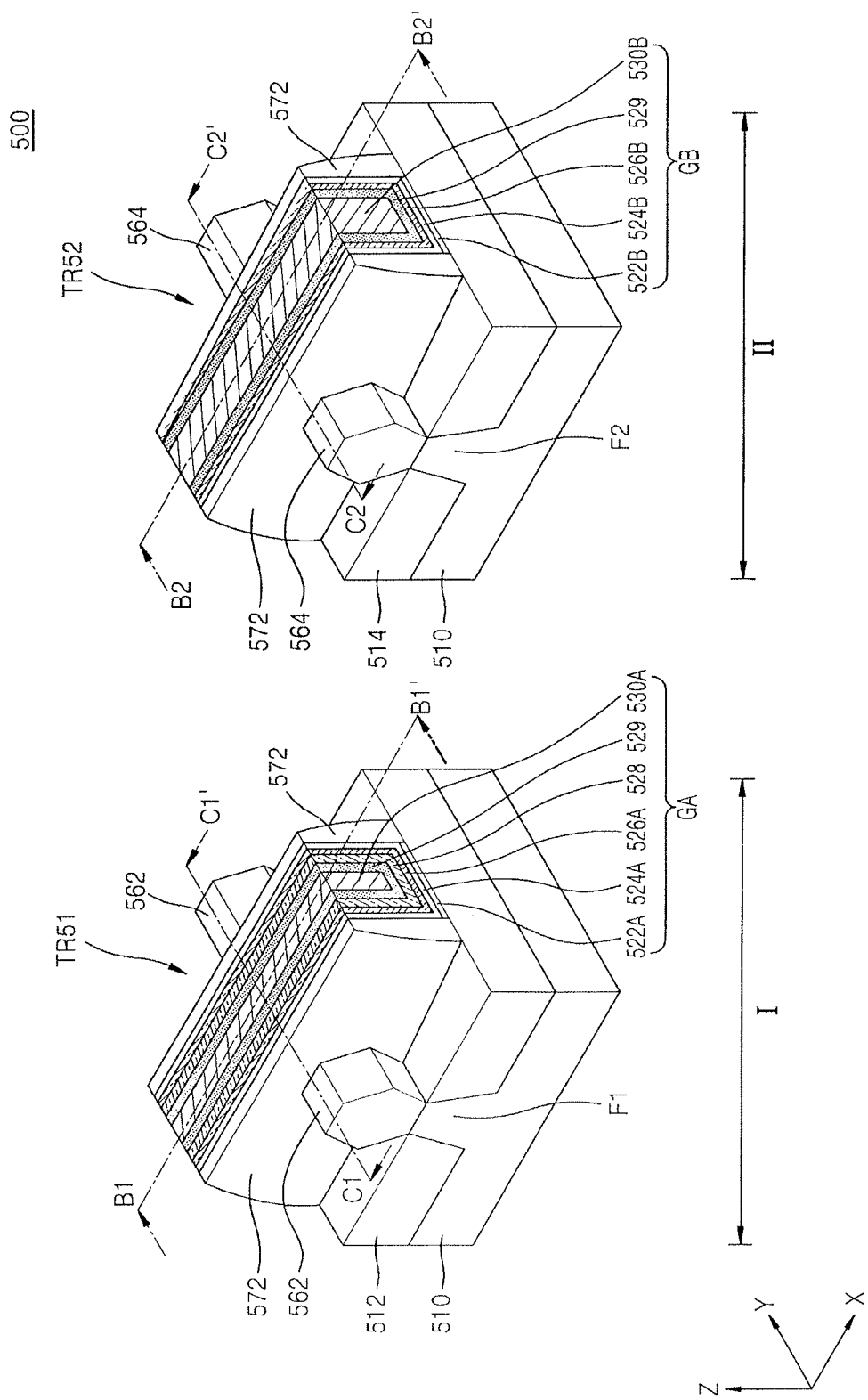
FIGS. 5A to 5C illustrate diagrams of an integrated circuit device according to embodiments.
Figure 5B:
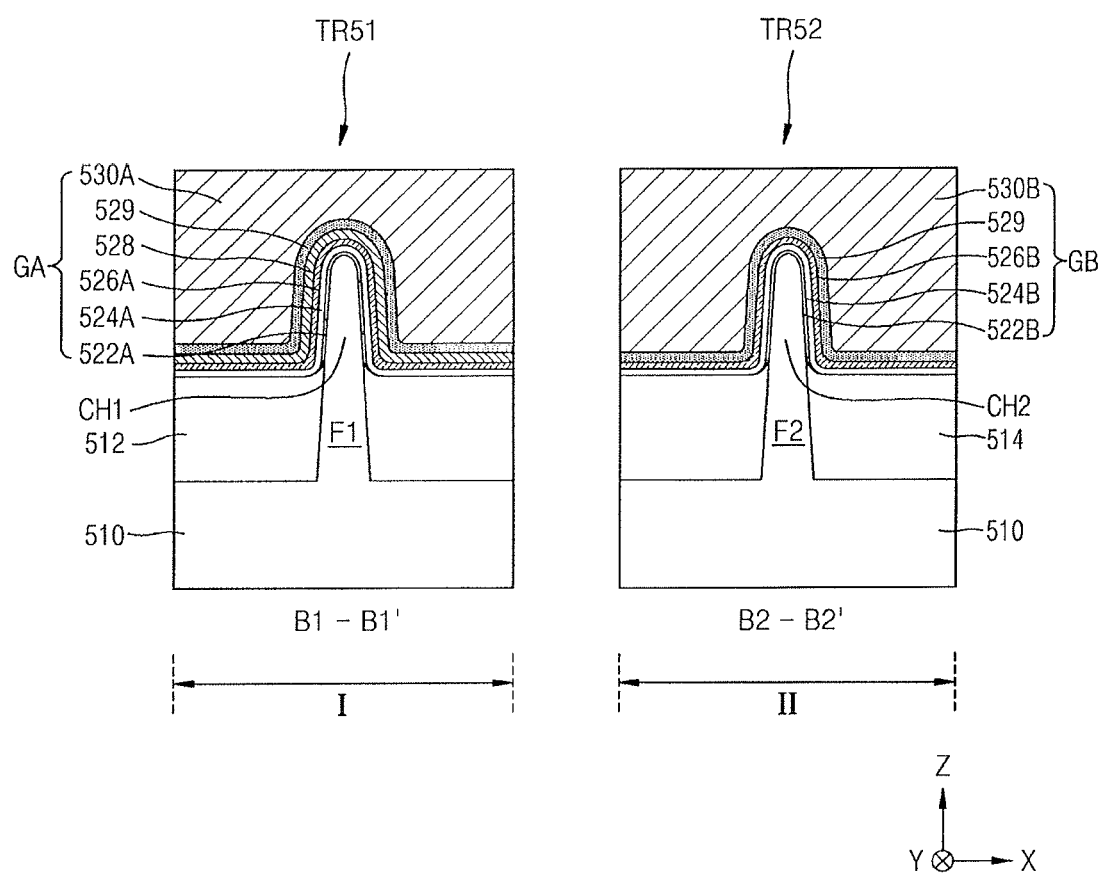
Figure 5C:
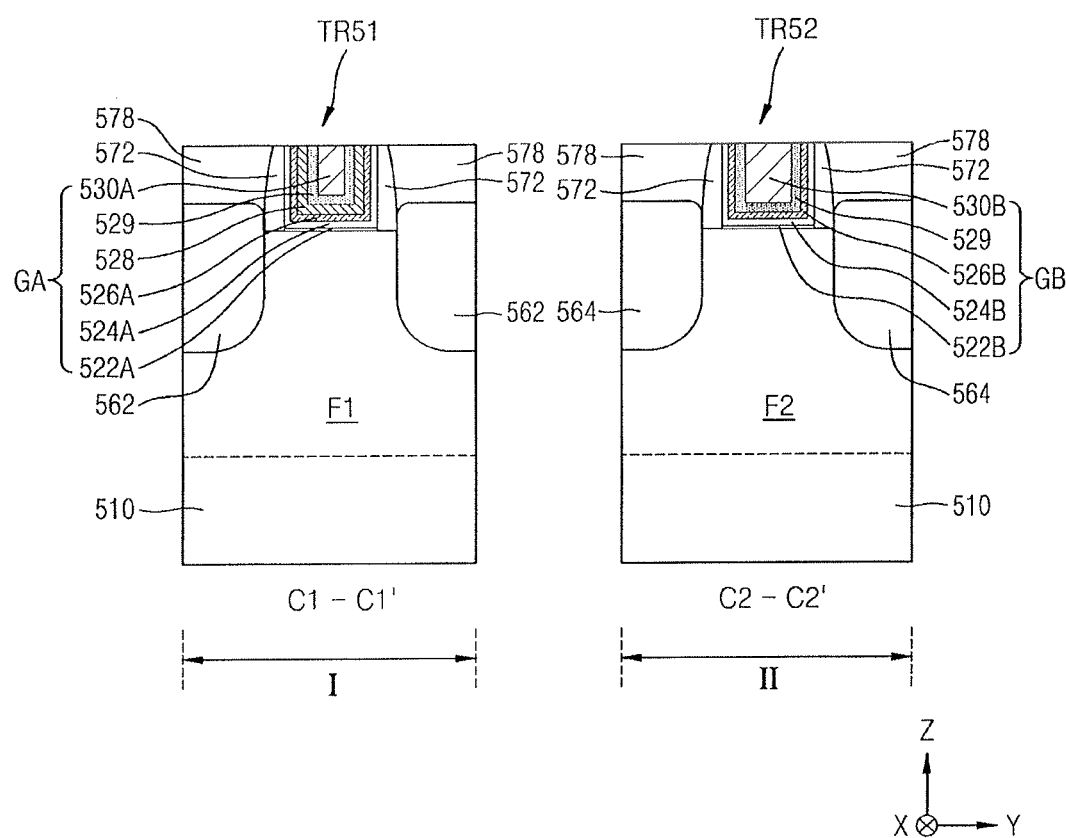

FIGS. 5A to 5C illustrate an integrated circuit device according to embodiments. FIG. 5A illustrates perspective views of main components of an integrated circuit device 500 including a first transistor TR51 and a second transistor TR52, which have FinFET structures, FIG. 5B illustrates cross-sectional views respectively taken along lines B1-B1' and B2-B2' of FIG. 5A, and FIG. 5C illustrates cross-sectional views respectively taken along lines C1-C1' and C2-C2' of FIG. 5A.

The integrated circuit device 500 may include a first fin-type active region F1 and a second fin-type active region F2, which respectively protrude from a first region I and a second region II of a substrate 510 in a direction (Z direction) perpendicular to a main surface of the substrate 510.

The first region I and the second region II refer to different regions of the substrate 510 and may be regions performing different functions on the substrate 510. The first transistor TR51 and the second transistor TR52, which require different threshold voltages, may be respectively formed in the first region I and the second region II. In an implementation, the first region I may be a PMOS transistor region, and the second region II may be an NMOS transistor region.

The first fin-type active region F1 and the second fin-type active region F2 may extend along one direction (Y direction in FIGS. 5A to 5C). In the first region I and the second region II, a first device isolation film 512 and a second device isolation film 514 may be formed on the substrate 510 and may respectively cover lower sidewalls of the first fin-type active region F1 and the second fin-type active region F2. The first fin-type active region F1 may protrude in a fin shape upwards from the first device isolation film 512, and the second fin-type active region F2 may protrude in a fin shape upwards from the second device isolation film 514.

The first fin-type active region F1 and the second fin-type active region F2 may respectively have a first channel region CH1 and a second channel region CH2 on upper portions thereof. A P-type channel may be formed in the first channel region CH1, and an N-type channel may be formed in the second channel region CH2.

In an implementation, each of the first fin-type active region F1 and the second fin-type active region F2 may include a single material. For example, the first fin-type active region F1 and the second fin-type active region F2, which respectively include the first channel region CH1 and the second channel region CH2, may include Si in all regions thereof. In an implementation, the first fin-type active region F1 and the second fin-type active region F2 may respectively include a region including Ge and a region including Si.

Each of the first and second device isolation films 512 and 514 may include a silicon-containing insulating film, e.g., a silicon oxide film, a silicon nitride film, a silicon oxynitride film, a silicon carbonitride film, or the like, polysilicon, or combinations thereof.

In the first region I, a first gate structure GA may extend on the first fin-type active region F1 in a direction (X direction in FIGS. 5A to 5C) intersecting the extension direction of the first fin-type active region F1, the first gate structure GA including a first interfacial film 522A, a first high-K dielectric film 524A, a first etch stop layer 526A, a first work function adjusting layer 528, a second work function adjusting layer 529, and a first gap-fill gate film 530A, which are stacked in this stated order. The first transistor TR51 may be formed at a point at which the first fin-type active region F1 intersects the first gate structure GA.

In the second region II, a second gate structure GB extends on the second fin-type active region F2 in the direction (X direction in FIGS. 5A to 5C) intersecting the extension direction of the second fin-type active region F2, the second gate structure GB including a second interfacial film 522B, a second high-K dielectric film 524B, a second etch stop layer 526B, the second work function adjusting layer 529, and a second gap-fill gate film 530B, which are stacked in this stated order. The second transistor TR52 may be formed at a point at which the second fin-type active region F2 intersects the second gate structure GB.

The first interfacial film 522A and the second interfacial film 522B may include films obtained by oxidizing surfaces of the first fin-type active region F1 and the second fin-type active region F2, respectively. In an implementation, each of the first interfacial film 522A and the second interfacial film 522B may include a low-K dielectric material layer having a dielectric constant of about 9 or less, e.g., a silicon oxide film, a silicon oxynitride film, or combinations thereof. In an implementation, each of the first interfacial film 522A and the second interfacial film 522B may have a thickness of, e.g., about 5 Å to about 20 Å. In an implementation, the first interfacial film 522A and the second interfacial film 522B may be omitted.

Each of the first high-K dielectric film 524A and the second high-K dielectric film 524B may include a metal oxide having a higher dielectric constant than a silicon oxide film. For example, each of the first high-K dielectric film 524A and the second high-K dielectric film 524B may have a dielectric constant of about 10 to about 25. In an implementation, each of the first high-K dielectric film 524A and the second high-K dielectric film 524B may include, e.g., hafnium oxide, hafnium oxynitride, hafnium silicon oxide, lanthanum oxide, lanthanum aluminum oxide, zirconium oxide, zirconium silicon oxide, tin oxide, tin oxynitride, tin oxycarbonitride, tantalum oxide, titanium oxide, barium strontium titanium oxide, barium titanium oxide, strontium titanium oxide, yttrium oxide, aluminum oxide, lead scandium tantalum oxide, lead zinc niobate, or combinations thereof.

The first high-K dielectric film 524A and the second high-K dielectric film 524B may be formed by an ALD or CVD process. In an implementation, each of the first high-K dielectric film 524A and the second high-K dielectric film 524B may have a thickness of, e.g., about 10 Å to about 40 Å.

When each of the first high-K dielectric film 524A and the second high-K dielectric film 524B includes a Sn-containing film, the first high-K dielectric film 524A and the second high-K dielectric film 524B may be formed by using a thin film forming raw material, which includes the tin precursor compound represented by Chemical Formula (I) as set forth above.

Each of the first etch stop layer 526A and the second etch stop layer 526B may include a SnN film. The first etch stop layer 526A and the second etch stop layer 526B may be formed by a CVD or ALD process by using a thin film forming raw material, which includes the tin precursor compound represented by Chemical Formula (I) as set forth above, and using a nitrogen atom-containing reactive gas, for example, $NH_3$ gas.

The first work function adjusting layer 528 may be for adjusting a work function of the P-type transistor, and may include, e.g., TiN.

The second work function adjusting layer 529 may be for adjusting a work function of the N-type transistor, and may include, e.g., TiAl, TiAlC, TiAlN, TaC, TiC, HfSi. or combinations thereof.

Each of the first gap-fill gate film 530A and the second gap-fill gate film 530B may include, e.g., tungsten (W).

In an implementation, a conductive barrier film may be interposed between the second work function adjusting layer 529 and the first gap-fill gate film 530A, and/or between the second work function adjusting layer 529 and the second gap-fill gate film 530B. In an implementation, the conductive barrier film may include a metal nitride, e.g., TiN, TaN, SnN, or combinations thereof.

A pair of first source/drain regions 562 may be formed in the first fin-type active region F1 at both sides of the first gate structure GA. A pair of second source/drain regions 564 may be formed in the second fin-type active region F2 at both sides of the second gate structure GB.

The pairs of first and second source/drain regions 562 and 564 may respectively include semiconductor layers epitaxially grown on the first and second fin-type active regions F1 and F2. Each of the pairs of first and second source/drain regions 562 and 564 may include an embedded SiGe structure including a plurality of epitaxially grown SiGe layers, an epitaxially grown Si layer, or an epitaxially grown SiC layer.

In an implementation, as illustrated in FIGS. 5A and 5C, the pairs of first and second source/drain regions 562 and 564 may have a specific shape. In an implementation, the pairs of first and second source/drain regions 562 and 564 may have various sectional shapes.

Each of the first and second transistors TR51 and TR52 may include a 3-dimensional structured MOS transistor in which a channel is formed on an upper surface and both side surfaces of each of the first and second fin-type active regions F1 and F2. The MOS transistor may constitute an NMOS transistor or a PMOS transistor.

In the first region I and the second region II, an insulating spacer 572 may be formed on both sides of each of the first and second gate structures GA and GB. As shown in FIG. 5C, an insulating film 578 covering the insulating spacer 572 may be formed at an opposite side to each of the first and second gate structures GA and GB, with the insulating spacer 572 being between each of the first and second gate structures GA and GB and the insulating film 578. In an implementation, the insulating spacer 572 may include a silicon nitride film and the insulating film 578 may include a silicon oxide film.

The following Examples and Comparative Examples are provided in order to highlight characteristics of one or more embodiments, but it will be understood that the Examples and Comparative Examples are not to be construed as limiting the scope of the embodiments, nor are the Comparative Examples to be construed as being outside the scope of the embodiments. Further, it will be understood that the embodiments are not limited to the particular details described in the Examples and Comparative Examples.

Example 1

Synthesis of Compound $Sn[N(iPr)_2]_2Me_2$ 100 g (0.35 mol) of $SnCl_4$ and 300 ml of n-hexane were introduced into a 1,000 ml flask and mixed. 81.4 g (0.455 mol) of $Sn(Me)_4$ was slowly added into the flask in an ice bath. The components were stirred for about 2 hours, thereby completing synthesis of $SnMe_2Cl_2$.

Next, 204 g (1.91 mol) of lithium diisopropylamide (LDA) was diluted with ethyl ether and then slowly added into the flask. The reaction was completed by stirring the components for 5 hours, followed by removing a solvent and by-products at reduced pressure.

Next, the resultant was purified at a temperature of 80° C. and a pressure of 0.6 Torr, thereby obtaining 120 g of a compound $Sn[N(iPr)_2]_2Me_2$ (yield: 77%).

Figure 6:
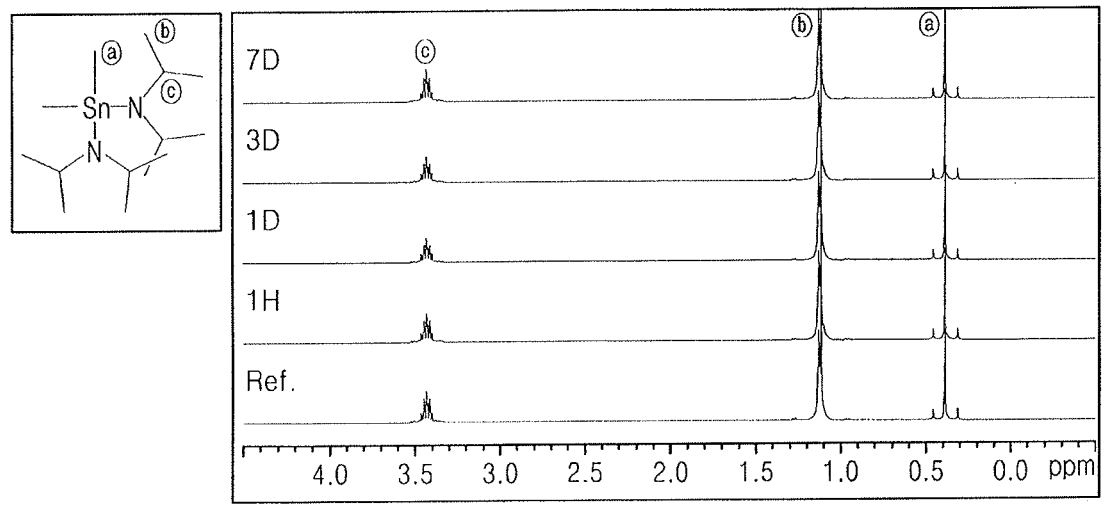
FIG. 6 illustrates a graph depicting results of $^1$H NMR analysis of a compound obtained in Example 1.

The obtained compound underwent $^1H$ NMR analysis. Results are shown in FIG. 6.

(Analysis)

$^1H$ NMR (C6D6): δ 3.42 (st, 4H), 1.12 (d, 24H), 0.38 (s, 6H)

Evaluation Example 1

Evaluation of Properties of Compound $Sn[N(iPr)_2]_2Me_2$

Figure 7:
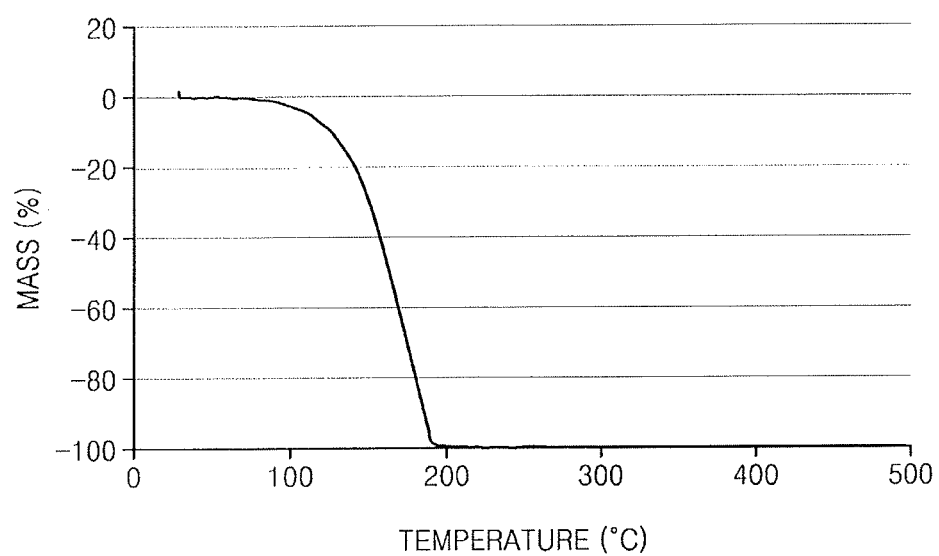
FIG. 7 illustrates a graph depicting results of thermal gravimetric analysis (TGA) of the compound $Sn[N(iPr)_2]_2Me_2$ obtained in Example 1.

FIG. 7 illustrates a graph depicting results of thermal gravimetric analysis (TGA) of the compound $Sn[N(iPr)_2]_2Me_2$ obtained in Example 1. 10 mg of the compound $Sn[N(iPr)_2]_2Me_2$ was analyzed at a heating rate of 10° C./min under an argon atmosphere.

FIG. 7 shows weight loss percentage along with temperature. As may be seen in FIG. 7, the $Sn[N(iPr)_2]_2Me_2$ exhibited quick vaporization and was vaporized to a degree of 99% or more at about 190° C. without residue due to thermal decomposition.

Example 2

A tin oxide thin film was fabricated on a silicon substrate by atomic layer deposition (ALD).

The silicon substrate was loaded into a reaction chamber and maintained at a temperature of 200° C. The compound Sn[N(iPr)$_2$]$_2$Me$_2$ synthesized in Example 1 filled a stainless steel bubbler container and was maintained at a temperature of 74° C. Next, the tin precursor compound was vaporized in the bubbler container and supplied onto a surface of the silicon substrate using argon gas as a carrier gas (25 sccm), thereby chemisorbing the compound Sn[N(iPr)$_2$]$_2$Me$_2$ onto the silicon substrate. Next, unadsorbed Sn[N(iPr)$_2$]$_2$Me$_2$ was purged with argon gas (4,000 sccm) for 15 seconds and thereby removed from the reaction chamber.

Next, ozone gas having a concentration of 220 g/m$^3$ was supplied into the reaction chamber at a flow rate of 300 sccm for 7 seconds, thereby forming the tin oxide thin film. Finally, by-products and unreacted materials were purged with argon gas (4,000 sccm) for 10 seconds and thereby removed from the reaction chamber.

When the processes set forth above were defined as 1 cycle, a tin oxide thin film was formed by repeating 100 cycles and underwent thickness measurement.

In addition, deposition for 100 cycles was performed at each temperature while changing the temperature inside the reaction chamber, and a deposition thickness per cycle at each temperature was measured. Results are shown in FIG. 8.

Figure 8:
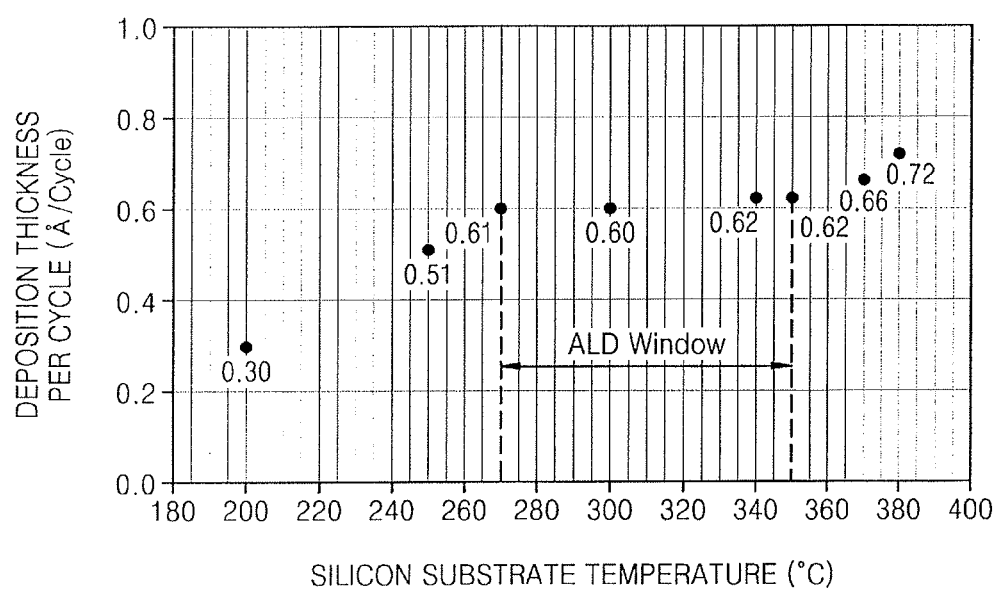
FIG. 8 illustrates a graph depicting measurement results of deposition thickness per cycle along with deposition temperature, when deposition was performed using the compound $Sn[N(iPr)_2]_2Me_2$ synthesized in Example 1.

As shown in FIG. 8, it may be seen that the deposition thickness per cycle changed along with the deposition temperature varying from 200° C. to 270° C. Therefore, it may be seen that a deposition mechanism other than ALD could contributed to the formation of the thin film at 200° C. to 270° C. Likewise, it may be seen that the deposition thickness per cycle changed along with the deposition temperature varying from 350° C. to 380° C. Therefore, it may be seen that a deposition mechanism other than ALD, e.g., chemical vapor deposition, may have contributed to the formation of the thin film at 350° C. to 380° C.

It may be seen that the deposition thickness per cycle was constant even when the deposition temperature varied in a range of 270° C. to 350° C. For example, in a temperature range of 270° C. to 350° C., the tin oxide thin film was formed by a mechanism of ALD.

Figure 9:
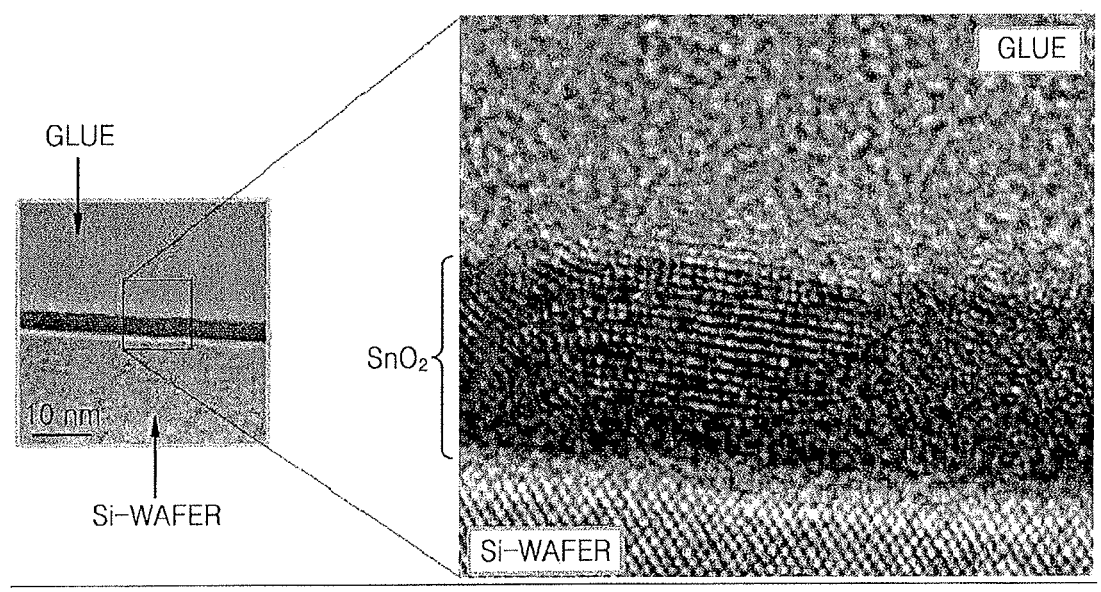
FIG. 9 illustrates a transmission electron microscope (TEM) image of a tin oxide thin film formed in Example 2.
Figure 10:
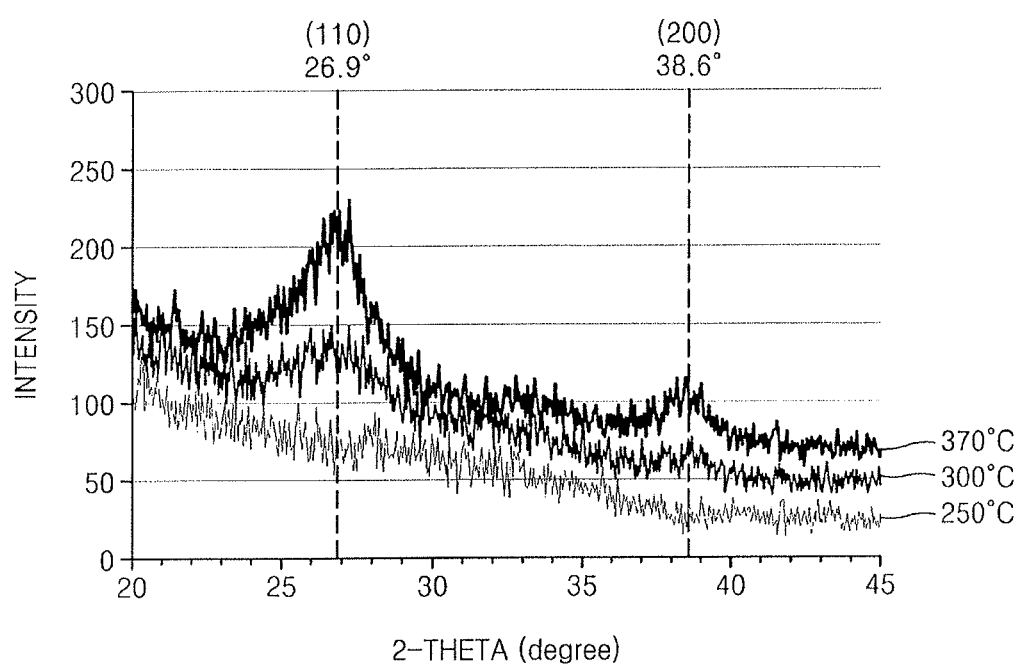
FIG. 10 illustrates a graph depicting results obtained by performing X-ray diffraction (XRD) analysis on a tin oxide thin film formed in Example 2.

To analyze a crystal structure of the tin oxide thin film formed as above, transmission electron microscope (TEM) analysis and X-ray diffraction (XRD) analysis were performed on the tin oxide thin film, and an image obtained by analysis and a graph of analysis results are respectively shown in FIGS. 9 and 10.

Referring to FIG. 9, it may be seen that the tin oxide (SnO$_2$) thin film was formed on the silicon substrate and a glue layer for TEM analysis was formed on the tin oxide thin film. As shown in FIG. 9, it may be seen that the tin oxide thin film was formed to a relatively uniform thickness on the silicon substrate.

The composition of the tin oxide thin film was analyzed by X-ray photoelectron spectroscopy (XPS), and results thereof are shown in Table 1. Referring to Table 1, it may be seen that the deposited thin film included about 33.3 atom % of tin and about 66.7 atom % of oxygen based on a silicon substrate temperature of 300° C., and a stoichiometric ratio of tin to oxygen was about 1:2. Thus, the thin film had a composition of SnO$_2$. In addition, nitrogen, carbon, and halogen elements, which were impurities, were not detected, and it may be seen that the pure tin oxide thin film free from impurities was formed.

TABLE 1

| Temperature | Atom % (XPS) | | | | |
|---|---|---|---|---|---|
| (° C.) | Sn 3d | O 1s | N 1s | C 1s | O/Sn |
| 270 | 32.6 | 67.4 | 0.0 | 0.0 | 2.1 |
| 300 | 33.3 | 66.7 | 0.0 | 0.0 | 2.0 |
| 340 | 32.0 | 68.0 | 0.0 | 0.0 | 2.1 |
| 350 | 32.6 | 67.4 | 0.0 | 0.0 | 2.1 |

Referring to FIG. 10, it may be seen that, at a 2-theta (θ) value of 26 degree (°) where peaks exist, the intensity of the peak representing a rutile phase increased with increasing deposition temperature. For example, crystallinity of the rutile phase was observed at 300° C., and it may be seen that the crystallinity increased with increasing temperature. In addition, the crystallinity could also be confirmed by the TEM image shown in FIG. 9.

Example 3

Synthesis of Compound Sn[N(Me)$_2$]$_2$Me$_2$ 117 g (0.45 mol) of SnCl$_4$ and 300 ml of n-hexane were introduced into a 1,000 ml flask and mixed. 81.4 g (0.455 mol) of Sn(Me)$_4$ was slowly added into the flask in an ice bath. The components were stirred for about 2 hours, thereby completing synthesis of SnMe$_2$Cl$_2$.

Next, 101 g (1.98 mol) of lithium dimethylamide (Li-DMA) was diluted with ethyl ether and then slowly added into the flask. The reaction was completed by stirring the components for 5 hours, followed by removing a solvent and by-products at reduced pressure.

Next, the resultant was purified at a temperature of 80° C. and a pressure of 0.6 Torr, thereby obtaining 120 g of a compound Sn[N(Me)$_2$]$_2$Me$_2$ (yield: 56%).

Figure 11:
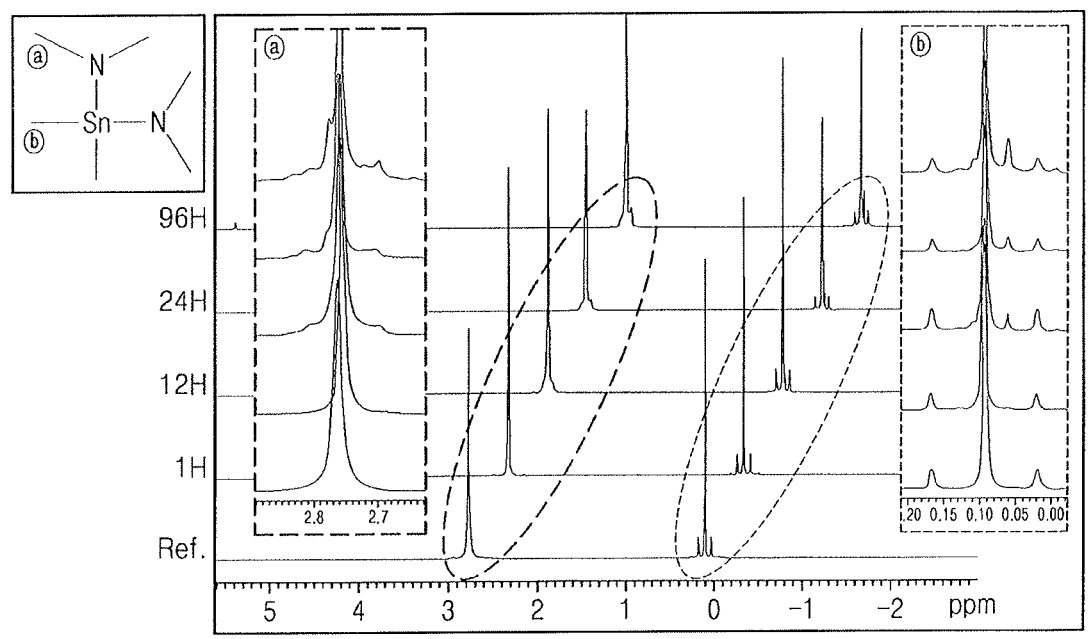
FIG. 11 illustrates a graph depicting results of $^1$H NMR analysis of a compound obtained in Example 3.

The obtained compound underwent $^1$H NMR analysis. The results are shown in FIG. 11.

(Analysis)

$^1$H NMR (C6D6): δ 2.76 (s, 12H), 0.09 (s, 6H)

Example 4

A tin oxide thin film was formed in the same manner as in Example 2 except that the compound Sn[N(Me)$_2$]$_2$Me$_2$ was used instead of the compound Sn[N(iPr)$_2$]$_2$Me$_2$, and a deposition thickness of tin oxide per cycle was measured at each deposition temperature. Results are shown in FIG. 12.

Figure 12:
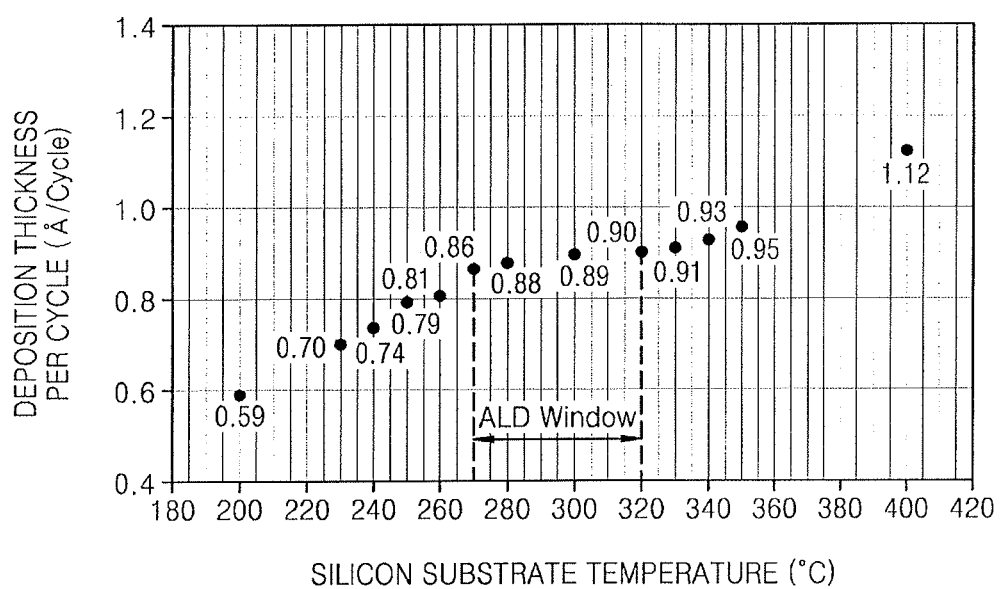
FIG. 12 illustrates a graph depicting measurement results of deposition thickness per cycle along with deposition temperature, when deposition was performed by using $Sn[N(Me)_2]_2Me_2$, synthesized in Example 3.

As shown in FIG. 12, it may be seen that the deposition thickness per cycle changed along with the deposition temperature varying from 200° C. to 270° C. Therefore, it may be seen that a deposition mechanism other than ALD could have contributed to the formation of the thin film at 200° C. to 270° C. Likewise, it may be seen that the deposition thickness per cycle changed along with the deposition temperature varying from 320° C. to 400° C. Therefore, it may be seen that a deposition mechanism other than ALD, e.g., chemical vapor deposition, could have contributed to the formation of the thin film at 320° C. to 400° C.

It may be seen that the deposition thickness per cycle was constant even when the deposition temperature varied in a range of 270° C. to 320° C. For example, in a temperature range of 270° C. to 320° C., the tin oxide thin film was formed by a mechanism of ALD.

Comparative Example 1

Synthesis of Compound Sn[N(Me)$_2$]$_4$ 100 g (0.35 mol) of SnCl$_4$ and 300 ml of n-hexane were introduced into a 1,000 ml flask and mixed. 80 g (1.57 mol) of lithium dimethylamide (Li-DMA) was diluted with ethyl ether and then slowly added into the flask in an ice bath, followed by stirring the components at ambient temperature for 8 hours, thereby completing the reaction. After completing the reaction, LiCl salts were removed by filtering the product, thereby obtaining a solution. Next, a solvent and by-products were removed from the obtained solution at reduced pressure. After the removal of the solvent, the solution was purified, thereby obtaining 63 g of a compound Sn[N(Me)$_2$]$_4$ (yield: 70%).

(Analysis)

$^1$H NMR (C6D6): δ 2.79 (s, 24H)

Formation of Tin Oxide Thin Film

A tin oxide thin film was formed in the same manner as in Example 2 except that the compound Sn[N(Me)$_2$]$_4$ was used instead of the compound Sn[N(iPr)$_2$]$_2$Me$_2$, and a deposition thickness of tin oxide per cycle was measured at each deposition temperature. Results are shown in FIG. 13.

Figure 13:
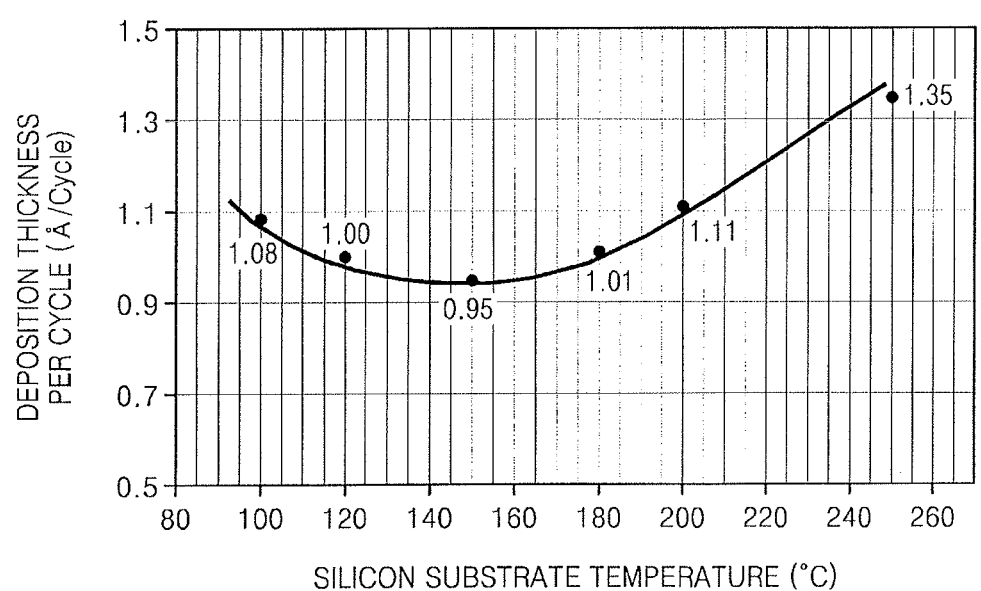
FIG. 13 illustrates a graph depicting measurement results of deposition thickness per cycle along with deposition temperature, when deposition was performed by using $Sn[N(Me)_2]_4$, synthesized in Comparative Example 1.

As shown in FIG. 13, the deposition thickness per cycle decreased along with the deposition temperature varying from 100° C. to 150° C., and the deposition thickness per cycle increased along with the deposition temperature increasing from 150° C. to 400° C. For example, a temperature range, in which the deposition thickness per cycle was constant, was not observed. This means that a range allowing deposition by a mechanism of ALD to be dominant was not present throughout the whole temperature range when the compound Sn[N(Me)$_2$]$_4$ was used. Therefore, the compound Sn[N(Me)$_2$]$_4$ may be unsuitable as an ALD precursor.

When the compound Sn[N(Me)$_2$]$_4$ is used, there may be no temperature range allowing deposition by the mechanism of ALD to be dominant, and most deposition may be presumed to be performed by a mechanism of CVD. Therefore, it may be difficult to form a thin film with excellent step coverage on a surface of a structure having a high aspect ratio.

Comparative Example 2

Figure 14:
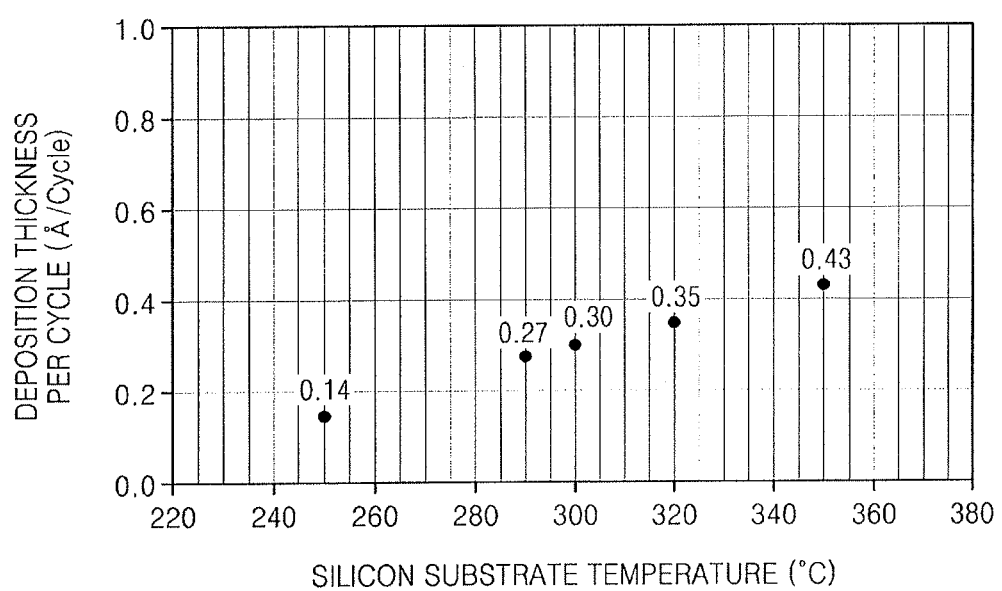
FIG. 14 illustrates a graph depicting measurement results of deposition thickness per cycle along with deposition temperature, when deposition was performed by using $Sn(Me)_4$.

A tin oxide thin film was formed in the same manner as in Example 2 except that Sn(Me)$_4$ was used instead of the Sn[N(iPr)$_2$]$_2$Me$_2$, and a deposition thickness of tin oxide per cycle was measured at each deposition temperature. Results are shown in FIG. 14. The Sn(Me)$_4$ was a commercially available product (Sigma-Aldrich Co., Ltd.), which had a 95% grade.

As shown in FIG. 14, the deposition thickness per cycle increased along with the deposition temperature varying from 250° C. to 350° C. For example, a temperature range, in which the deposition thickness per cycle was constant, was not observed. This means that a range allowing deposition by the mechanism of ALD to be dominant was not present throughout the whole temperature range. Therefore, the Sn(Me)$_4$ may be unsuitable as an ALD precursor.

When Sn(Me)$_4$ was used, there was no temperature range allowing deposition by the mechanism of ALD to be dominant, and most deposition was presumed to be performed by the mechanism of CVD. Therefore, it may be difficult to form a thin film with excellent step coverage on a surface of a structure having a high aspect ratio.

As is traditional in the field, embodiments are described, and illustrated in the drawings, in terms of functional blocks, units and/or modules. Those skilled in the art will appreciate that these blocks, units and/or modules are physically implemented by electronic (or optical) circuits such as logic circuits, discrete components, microprocessors, hard-wired circuits, memory elements, wiring connections, and the like, which may be formed using semiconductor-based fabrication techniques or other manufacturing technologies. In the case of the blocks, units and/or modules being implemented by microprocessors or similar, they may be programmed using software (e.g., microcode) to perform various functions discussed herein and may optionally be driven by firmware and/or software. Alternatively, each block, unit and/or module may be implemented by dedicated hardware, or as a combination of dedicated hardware to perform some functions and a processor (e.g., one or more programmed microprocessors and associated circuitry) to perform other functions. Also, each block, unit and/or module of the embodiments may be physically separated into two or more interacting and discrete blocks, units and/or modules without departing from the scope herein. Further, the blocks, units and/or modules of the embodiments may be physically combined into more complex blocks, units and/or modules without departing from the scope herein.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A method of forming a tin-containing material film, the method comprising:

forming a monolayer of a tin precursor compound on a substrate in a reaction space, the tin precursor compound having a structure represented by Chemical Formula (I);

forming a tin-containing material film by supplying a reactant onto the monolayer; and removing unreacted reactant from the vicinity of a surface of the tin-containing material film by purging the unreacted reactant, <Chemical Formula (I)>

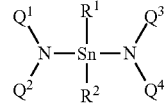

wherein R$^1$, R$^2$, Q$^1$, Q$^2$, Q$^3$, and Q$^4$ are each independently a C1 to C4 linear or branched alkyl group, and wherein:

the reactant includes $NH_3$, a monoalkylamine, a dialkylamine, a trialkylamine, an organic amine compound, a hydrazine compound, or mixtures thereof, and the tin material film is a tin nitride film.

2. The method as claimed in claim 1, wherein the tin precursor compound has a constant atomic layer deposition rate in a temperature range of about 270° C. to about 350° C.

3. The method as claimed in claim 1, wherein the tin precursor compound has a constant atomic layer deposition rate in a temperature range of about 270° C. to about 320° C.

4. The method as claimed in claim 1, wherein the tin-containing material film does not include halogen elements.

5. The method as claimed in claim 1, wherein forming the monolayer of the tin precursor compound having the structure represented by Chemical Formula (I) on the substrate in the reaction space includes supplying the tin precursor compound having the structure represented by Chemical Formula (I) onto the substrate for about 1 second to about 100 seconds.

6. The method as claimed in claim 1, wherein the tin-containing material film is a conductive barrier film, a tunnel barrier film of a gate dielectric film, a barrier metal film for liquid crystals, a member for thin film solar cells, a member for semiconductor equipment, or a nano-structure.

7. A method of forming a tin-containing material film, the method comprising:
providing a substrate in a reactor;
supplying a tin precursor to the substrate to form a monolayer of the tin precursor, the tin precursor being represented by Chemical Formula (I);
supplying a reactant onto the monolayer to form the tin-containing material film; and
purging the reactor, <Chemical Formula (I)>

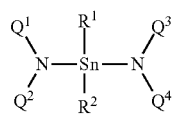

wherein, in Chemical Formula (I), $R^1$, $R^2$, $Q^1$, $Q^2$, $Q^3$, and $Q^4$ are each independently a C1 to C4 linear or branched alkyl group, and wherein:
the reactant includes $NH_3$, a monoalkylamine, a dialkylamine, a trialkylamine, an organic amine compound, a hydrazine compound, or mixtures thereof, and the tin material film is a tin nitride film.

8. The method as claimed in claim 7, wherein the tin-containing material film does not include halogen elements.

9. The method as claimed in claim 7, wherein the tin precursor is supplied to the substrate for about 1 second to about 100 seconds.

10. The method as claimed in claim 7, wherein $Q^1$, $Q^2$, $Q^3$, and $Q^4$ are the same and are each a methyl group, an ethyl group, a n-propyl group, or an isopropyl group.

11. The method as claimed in claim 10, wherein $R^1$ and $R^2$ are the same and are each a methyl group, an ethyl group, a n-propyl group, or an isopropyl group.

12. A method of forming a tin-containing material film, the method comprising sequentially performing a plurality of deposition cycles, each deposition cycle including:
forming a monolayer of a tin precursor compound on a substrate in a reaction space, the tin precursor compound having a structure represented by Chemical Formula (I);
forming a tin-containing material film by supplying a reactant onto the monolayer; and
removing unreacted reactant from the vicinity of a surface of the tin-containing material film by purging the unreacted reactant, <Chemical Formula (I)>

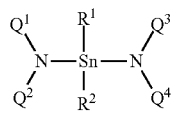

wherein $R^1$, $R^2$, $Q^1$, $Q^2$, $Q^3$, and $Q^4$ are each independently a C1 to C4 linear or branched alkyl group, and
wherein:
the reactant includes $NH_3$, a monoalkylamine, a dialkylamine, a trialkylamine, an organic amine compound, a hydrazine compound, or mixtures thereof, and the tin material film is a tin nitride film.

* * * * *